(12) United States Patent
Pratt et al.

(10) Patent No.: US 9,735,741 B2
(45) Date of Patent: Aug. 15, 2017

(54) RECEIVERS FOR DIGITAL PREDISTORTION

(71) Applicant: Analog Devices Global, Hamilton (BM)

(72) Inventors: Patrick Joseph Pratt, Mallow (IE); Ronald D. Turner, Greensboro, NC (US); Joseph B. Brannon, Greensboro, NC (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/472,243

(22) Filed: Aug. 28, 2014

(65) Prior Publication Data

US 2016/0065147 A1  Mar. 3, 2016

(51) Int. Cl.
*H03F 1/32* (2006.01)
*H03F 3/195* (2006.01)
(Continued)

(52) U.S. Cl.
CPC ......... *H03F 1/3247* (2013.01); *H03F 1/3258* (2013.01); *H03F 3/19* (2013.01); *H03F 3/195* (2013.01); *H03F 3/21* (2013.01); *H03F 3/245* (2013.01); *H03F 2200/451* (2013.01); *H03F 2201/3215* (2013.01); *H03F 2201/3233* (2013.01)

(58) Field of Classification Search
CPC .... H04B 1/1027; H04B 1/123; H04B 1/1036; H03F 1/3247; H03F 1/3294; H03F 2200/102; H03F 1/3258; H03F 3/195; H03F 3/245; H03F 3/19; H03F 3/21; H03F 2201/3233; H03F 2201/3215; H03F 2200/451
See application file for complete search history.

(56) References Cited

U.S. PATENT DOCUMENTS 5,130,663 A  7/1992  Tattersall, Jr.
5,923,214 A  7/1999  Mitzlaff
(Continued)

FOREIGN PATENT DOCUMENTS

EP  1732207  12/2006
EP  2991221 A1  3/2016

OTHER PUBLICATIONS

Yu, Chao, et al., "Band-Limited Volterra Series-Based Digital Predistortion for Wideband RF Power Amplifiers," IEEE Transactions on Microwave Theory and Techniques, vol. 60, No. 12, pp. 4198-4208, Dec. 2012.

(Continued)

*Primary Examiner* — Syed Haider
(74) *Attorney, Agent, or Firm* — Schwegman, Lundberg & Woessner, P.A.

(57) ABSTRACT

Aspects of this disclosure relate to a receiver for digital predistortion (DPD). The receiver includes an analog-to-digital converter (ADC) having a sampling rate that is lower than a signal bandwidth of an output of a circuit having an input that is predistorted by DPD. DPD can be updated based on feedback from the receiver. According to certain embodiments, the receiver can be a narrowband receiver configured to observe sub-bands of the signal bandwidth. In some other embodiments, the receiver can include a sub-Nyquist ADC.

28 Claims, 15 Drawing Sheets

(51) Int. Cl.
*H03F 3/24* (2006.01)
*H03F 3/19* (2006.01)
*H03F 3/21* (2006.01)

(56) References Cited

U.S. PATENT DOCUMENTS

| | | | |
|---|---|---|---|
| 5,959,499 | A | 9/1999 | Khan et al. |
| 6,570,444 | B2 | 5/2003 | Wright |
| 7,170,342 | B2 | 1/2007 | Suzuki et al. |
| 7,539,464 | B2 | 5/2009 | Suzuki et al. |
| 8,019,015 | B2 | 9/2011 | Moffatt et al. |
| 8,391,809 | B1 * | 3/2013 | Fuller .................. H04B 1/0475 455/114.3 |
| 8,536,943 | B2 | 9/2013 | Irvine |
| 8,548,403 | B2 | 10/2013 | Kim et al. |
| 2002/0021764 | A1 * | 2/2002 | Posti .................... H03F 1/3247 375/296 |
| 2002/0027474 | A1 * | 3/2002 | Bonds .................. H03F 1/3229 330/149 |
| 2002/0127986 | A1 * | 9/2002 | White .................... H04B 1/123 455/194.2 |
| 2004/0096010 | A1 * | 5/2004 | Koval ................ H04L 25/4902 375/298 |
| 2006/0276146 | A1 * | 12/2006 | Suzuki ................. H03F 1/3252 455/114.3 |
| 2010/0142598 | A1 * | 6/2010 | Murray ................ H04B 1/0483 375/219 |
| 2011/0135034 | A1 * | 6/2011 | Mujica .................. H03F 1/3247 375/296 |
| 2013/0094610 | A1 * | 4/2013 | Ghannouchi ......... H03F 1/3247 375/296 |
| 2013/0120062 | A1 | 5/2013 | Lozhkin |
| 2013/0200951 | A1 * | 8/2013 | Irvine ................... H03F 1/3247 330/149 |
| 2013/0243121 | A1 | 9/2013 | Bai |
| 2014/0065989 | A1 | 3/2014 | McLaurin |
| 2014/0139286 | A1 * | 5/2014 | Laporte ................ H03F 1/3247 330/149 |
| 2014/0161207 | A1 * | 6/2014 | Teterwak .............. H04L 27/368 375/297 |
| 2014/0213206 | A1 * | 7/2014 | Morris .................... H04L 27/36 455/226.1 |
| 2015/0194989 | A1 * | 7/2015 | Mkadem ............... H03F 1/3247 375/297 |

OTHER PUBLICATIONS

European Search Report for European Patent Application No. 15181161.9 dated Dec. 1, 2015, 10 pages.
"European Application Serial No. 15181161.9, Extended European Search Report mailed Dec. 1, 2015", 10 pgs.

\* cited by examiner

RECEIVERS FOR DIGITAL PREDISTORTION

TECHNICAL FIELD

The disclosed technology relates to electronics, and, more particularly, to predistorting inputs to circuits with non-linear responses.

DESCRIPTION OF THE RELATED TECHNOLOGY

Power amplifiers can generate amplified radio frequency (RF) signals that include non-linear distortions. The response of power amplifiers with non-linear distortions can result reduced modulation accuracy (e.g., reduced error vector magnitude (EVM)) and/or out of band emissions. Accordingly, communication systems can have specifications on power amplifier linearity.

Digital predistortion (DPD) can be applied to enhance linearity and/or efficiency of a power amplifier. Typically, digital predistortion involves applying predistortion at baseband frequencies in the digital domain. The predistortion can be characterized by a power amplifier model. The power amplifier model can be updated based on feedback from the power amplifier output. Digital predistortion can predistort an input to a power amplifier to reduce and/or cancel distortion. In a number of conventional systems, an output of a power amplifier is observed at a bandwidth that is at least approximately 1 to 5 times the underlying signal bandwidth to generate a power amplifier model. In such conventional systems, the sampling rate of an analog-to-digital converter (ADC) in a DPD receiver observing feedback from the power amplifier is at least approximately 2 to 10 times the original transmit input signal bandwidth.

SUMMARY

One aspect of this disclosure is and electronically-implemented method of predistortion. The method includes receiving, by a receiver, a feedback signal indicative of an output of an amplifier. The feedback signal has a bandwidth of interest and the receiver has a receive bandwidth that is narrower than the bandwidth of interest. The method also includes sweeping a receive frequency band of the receiver in isolated sub-bands of the feedback signal to observe the bandwidth of interest. The method also includes adaptively adjusting predistortion coefficients based on data generated from the isolated sub-bands of the feedback signal. The method further includes, using the adjusted predistortion coefficients, applying digital predistortion to cause an input to the amplifier to be predistorted.

The method can include performing an analog-to-digital conversion in the receiver at a sampling rate that is less than a signal bandwidth of the feedback signal. A number of different isolated sub-bands, such as at least 100, make up the bandwidth of interest. The bandwidth of interest can include most or all of the signal bandwidth of the feedback signal. The feedback signal can be a wideband signal. Accordingly, the bandwidth of interest can be at least about 0.5 GHz in some embodiments.

In the method, sweeping can include adjusting a frequency of a local oscillator of the receiver to adjust a translation of the feedback signal in the frequency domain. Alternatively or additionally, the method can include sweeping the receive frequency band of the receiver through the bandwidth of interest until the predistortion coefficients converge. In certain embodiments, the method can include isolating sub-bands of a signal indicative of the input to the amplifier, in which adjusting is based on the data generated from each of the isolated sub-bands of the feedback signal and the respective isolated sub-bands of the signal indicative of the input to the amplifier.

In the method, adjusting can include performing an indirect digital predistortion algorithm. Alternatively, adjusting can include performing a direct digital predistortion algorithm.

Another aspect of this disclosure is an apparatus that includes a receiver, a digital predistortion adaptation circuit, and a digital predistortion actuator circuit. The receiver is configured to receive a feedback signal indicative of an output of an amplifier. For sub-bands of a signal bandwidth of the feedback signal that together span at least a majority of the signal bandwidth, the receiver is configured to generate narrowband feedback corresponding to a particular sub-band of the signal bandwidth, in which each of the sub-bands is narrower than the signal bandwidth. The digital predistortion adaptation circuit is configured to process a signal indicative of an input to the amplifier to isolate a frequency band corresponding to the particular sub-band of the signal bandwidth. The digital predistortion adaptation circuit is also configured to update predistortion coefficients based on the narrowband feedback and the corresponding isolated frequency band of the signal indicative of the input of the amplifier. The digital predistortion actuator circuit is configured to cause predistortion in the input to the amplifier based on the updated predistortion coefficients.

The receiver can also be configured to perform diagnostics and/or Quality of Service (QoS) monitoring on a communications system that includes the amplifier. The receiver can be configured to sweep through the sub-bands of the entire signal bandwidth to generate the narrowband feedback. The sub-bands of the signal bandwidth can include, for example, at least 100 sub-bands.

The receiver can be configured to adjust a frequency of a local oscillator to adjust a translation of the feedback signal. The receiver can include an analog-to-digital converter having a sampling rate that is less than the signal bandwidth of the feedback signal.

The digital predistortion adaptation circuit can be configured to generate a full rate amplifier model based on the narrowband feedback signals and to generate an inverse amplifier model based on the full rate model. Alternatively, the digital predistortion adaptation circuit can be configured to implement direct digital predistortion adaptation.

The apparatus can include the amplifier, in which the amplifier is a radio frequency power amplifier. The apparatus can include, for example, a cable transmitter in which the cable transmitter comprises the amplifier.

Another aspect of this disclosure is an apparatus that includes a receiver, a digital predistortion adaptation circuit, and a digital predistortion actuator circuit. The receiver includes an analog-to-digital converter configured to digitize a feedback signal indicative of an output of an amplifier. The analog-to-digital converter has a sampling rate that is less than a signal bandwidth of the feedback signal. The digital predistortion adaptation circuit is in communication with the receiver, and the digital predistortion adaptation circuit is configured to generate an amplifier model based on the digitized feedback signal. The amplifier model has a bandwidth corresponding to the signal bandwidth of the feedback signal. The digital predistortion actuator circuit is in communication with the digital predistortion adaptation circuit, the digital predistortion actuator is a circuit configured to introduce predistortion to an input provided to the amplifier based on the amplifier model.

The digital predistortion adaptation circuit can include a decimator configured to rate match an indication of the amplifier input to the sampling rate of the analog-to-digital converter. The digital predistortion adaptation circuit can be configured to generate predistortion coefficients based on the amplifier model and to provide the predistortion coefficients to the digital predistortion actuator circuit. The sampling rate of the analog-to-digital converter can be, for example, at least 5 times less than the signal bandwidth of the feedback signal. The signal bandwidth of the feedback signal can be, for example, at least about 0.5 GHz.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments of the invention and are not intended to be limiting.

DETAILED DESCRIPTION OF CERTAIN EMBODIMENTS

Figure 1:
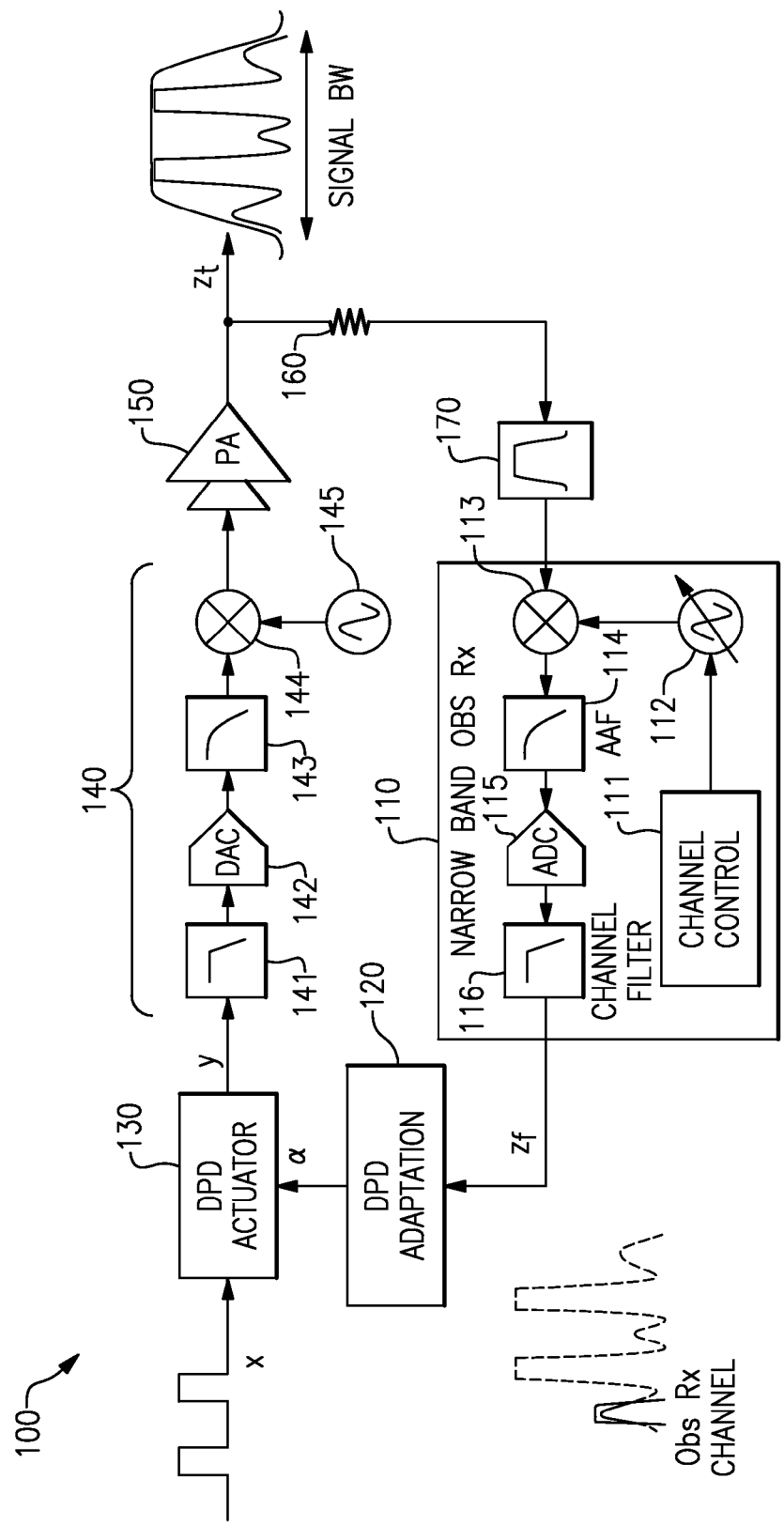
FIG. 1 is a schematic block diagram of a communications system with a narrowband receiver in communication with a digital predistortion (DPD) system, according to an embodiment.

The following detailed description of certain embodiments presents various descriptions of specific embodiments. However, the innovations described herein can be embodied in a multitude of different ways. In this description, reference is made to the drawings where like reference numerals can indicate identical or functionally similar elements. It will be understood that elements illustrated in the figures are not necessarily drawn to scale. Furthermore, any of the embodiments discussed herein can include more or fewer elements than illustrated, as appropriate. Additionally, the headings provided herein are provided for convenience only and do not limit the scope of the claims.

As discussed above, digital predistortion (DPD) can be implemented to improve linearity and/or efficiency of a power amplifier or other circuits having a non-linear response. Conventional DPD typically observes a receive bandwidth on the order of at least the transmit bandwidth. Accounting for out of band intermodulation distortion, the observed receive bandwidth is typically greater than the transmit bandwidth. Receivers that observe signals at multiples of the underlying signal bandwidth have been implemented for DPD. For example, some DPD systems account for up to fifth order intermodulation distortion. The Nyquist rate for canceling such fifth order distortions should be 10 times the signal bandwidth. Such a relatively wide bandwidth can impose efficiency loss due to the power consumption in the receive path. This efficiency loss can be more pronounced for wide signal bandwidths. Wide signal bandwidths can encompass signal bandwidths of at least 0.5 GHz or at least 1 GHz, for example. An example application with wideband signals that can benefit from DPD is a cable transmitter configured to transmit signals having a signal bandwidth of about 1 GHz. A DPD solution designed to linearize a power amplifier over a 1 GHz bandwidth typically has an observation bandwidth of 1 GHz and an ADC sampled at least at 2 GHz. In some implementations, an analog-to-digital converter (ADC) in the receiver can be the circuit with the largest power consumption in the receiver.

ADC power consumption in wideband receivers can be significant. For applications with signals having a bandwidth on the order of gigahertz (GHz), such as cable television, a receiver observing a signal at a frequency greater than the signal bandwidth can consume significant power. For instance, a 1 GHz signal can be transmitted with a power of about 0.5 Watts (W). An ADC with a 1 GHz bandwidth, corresponding to a 2 GHz sample rate, can consume about 2 W of power in a receive path that observes the 1 GHz signal. A DPD actuator and a DPD adaptation circuit are estimated to consume less than about 0.5 W of power in this system. For an output power of about 0.5 W, a receive path and DPD system that consumes 2.5 W would limit efficiency to about 20%. Accordingly, it would be desirable to reduce the power consumption of the receive path while implementing effective DPD. For instance, if the power consumption of the ADC in the receiver were 0.5 W and the DPD system and transmit path consumed about 0.5 W and a power amplifier had an output power of about 0.5 W, an efficiency of up to about 50% could be targeted.

This disclosure provides systems, apparatus and methods that implement a receiver that observes relatively narrow bands of a wideband signal for DPD. In some instances, a preexisting narrowband receiver provided for diagnostics, Quality of Service (QoS) monitoring, equalization, or any combination thereof can be used as the DPD receiver. DPD algorithms, particularly adaptation algorithms, are modified to operate with the narrowband receiver. According to certain embodiments, the narrowband receiver can have a bandwidth that is at least two orders of magnitude or at least three orders of magnitude less than the signal bandwidth of the wideband signal provided to the receiver. For instance, a narrowband receiver can have a bandwidth of about 6 MHz and a signal bandwidth of the wideband signal can be about 1 GHz. Narrowband feedback can be generated for sub-bands of a bandwidth of interest, such as the signal bandwidth of the wideband signal. This narrowband feedback can span the majority of the signal bandwidth of the wideband signal. The narrowband receiver can be swept over the bandwidth of interest. DPD can be trained from data generated by the sweep of the narrowband receiver. At each sub-band of the bandwidth of interest, a buffer of data can be captured. A model of the amplifier being predistorted can be systematically built up from successive narrowband data captures. A DPD solution can be derived from the amplifier model. Such DPD can be implemented either as indirect DPD or direct DPD. As used herein "indirect DPD" can refer to deriving DPD coefficients using (1) a predistorted input signal provided as an output of a DPD actuator (or an input to a non-linear circuit, such as a power amplifier), and (2) the output of the non-linear circuit. By contrast, as used herein, "direct DPD" can refer to deriving DPD coefficients using (1) an input signal provided as an input to a DPD actuator, and (2) an output of a non-linear circuit, such as a power amplifier.

This disclosure also provides systems, apparatus and methods that implement a receiver for DPD in which the receiver includes an ADC that digitizes a wideband signal at a sub-Nyquist rate. Although aliasing can be present in these digitized signals, a full rate model of an amplifier for which DPD is being applied can be generated. A DPD adaptation circuit can process a signal indicative of the amplifier input and decimate the signal to match the rate of the ADC. This can model the aliasing introduced by the ADC in the receiver. Coefficients for a DPD actuator can be updated based on the output of the sub-Nyquist ADC in the receiver and the decimated signal indicative of the amplifier input.

The DPD discussed herein can improve linearity of a power amplifier, or other non-linear circuits, in an efficient manner. Although some embodiments are discussed herein with reference to a power amplifier for illustrative purposes, it will be understood that any of the principles and advantages discussed herein can be applied to other amplifiers and/or other non-linear circuits, as appropriate. Using a narrowband receiver to observe a feedback signal, a suitable ADC in the receiver can consume significantly less power than in a similar receiver observing a signal with a bandwidth on the order of the signal bandwidth. This can have a significant effect on efficiency of a power amplifier or other non-linear circuit, for example, bringing efficiency from about 10-20% up to about 50% in certain applications. In certain implementations, preexisting hardware for diagnostics and/or equalization can make DPD relatively inexpensive to implement. Additionally, embodiments that relate to DPD using a sub-Nyquist ADC in a receiver can consume significantly less power than in a receiver with an ADC that samples a feedback signal at the Nyquist rate or higher.

Systems with Narrowband Receivers for DPD

With reference to FIG. 1, a schematic block diagram of a communications system 100 with a narrowband receiver 110 in communication with a DPD adaptation circuit 120 will be described. The illustrated communications system 100 includes the narrowband receiver 110, a DPD system including the DPD adaptation circuit 120 and a DPD actuator 130, a transmitter 140, a power amplifier 150, a feedback path element 160, and a feedback filter 170. The communications system 100 can include fewer or more elements than illustrated in FIG. 1 in some other embodiments.

An input signal X is received by the DPD actuator 130. The input signal X is illustrated by two active channels in the frequency domain in FIG. 1. The illustrated input signal X is a baseband digital signal. The DPD actuator 130 is configured to predistort the input signal X based on predistortion coefficients α provided by the DPD adaptation circuit 120. The DPD actuator 130 can provide the predistorted input Y to the transmitter 140. The DPD actuator 130 can be implemented by any suitable circuits. For instance, the DPD actuator 130 can be implemented by combinational logic circuits.

The transmitter 140 can upconvert the predistorted input Y from baseband to a higher frequency, such as a radio frequency (RF). The illustrated transmitter 140 includes a digital filter 141, a digital-to-analog converter (DAC) 142, an analog filter 143, a mixer 144, and a local oscillator 145. In the illustrated transmitter 140, the predistorted input Y is filtered in the digital domain by the digital filter 141. The output of the digital filter 141 is converted to an analog signal by the DAC 142. The analog signal provided by the DAC 142 is then filtered by an analog filter 143. The output of the analog filter 143 is upconverted to RF by the mixer 144, which receives a signal from the local oscillator 145 to translate the filtered analog signal from the analog filter 143 from baseband to RF. Other methods of implementing the transmitter are also possible. For instance, in another implementation (not illustrated) the output of the digital filter 141 can be directly converted to an RF signal by the DAC 142. In such an implementation, the RF signal provided by the DAC 142 can then be filtered by an analog filter 143. Since the DAC 142 has directly synthesized the RF signal in this implementation, the mixer 144 and the local oscillator 145 illustrated in FIG. 1 can be omitted.

As illustrated, the RF signal generated by the transmitter 140 is provided to the power amplifier 150. The power amplifier 150 amplifies the RF signal and provides an amplified RF signal $Z_T$. The amplified RF signal $Z_T$ can be provided to an antenna. The amplified RF signal $Z_T$ has a signal bandwidth. The signal bandwidth can be a wide bandwidth. As one non-limiting example, the signal bandwidth can be about 1 GHz. The amplified RF signal $Z_T$ is an amplified version of the input signal X. However, as shown in FIG. 1, the amplified RF signal $Z_T$ can have distortions outside of the main signal components. Such distortions can result from non-linearities in the response of the power amplifier 150. As discussed above, it can be desirable to reduce such non-linearities. Accordingly, feedback from the output of the power amplifier 150 can be provided to the DPD adaptation circuit 120 by way of the narrowband receiver 110. Then the DPD adaptation circuit 120 can cause the predistortion applied to the input signal X to be adjusted.

To provide feedback to the DPD adaptation circuit 120, a portion of the amplified RF signal $Z_T$ can be provided to the feedback element 160. As illustrated, the feedback element 160 can be a resistive element that feeds back a relatively small portion of the amplified RF signal to the narrowband receiver 110. In some other embodiments (not illustrated), a directional coupler or other suitable circuit can provide a portion of the amplified RF signal $Z_T$ to the narrowband receiver 110. The feedback filter 170 can serve to filter a signal from the feedback element 160 and provide the filtered signal as a feedback signal to the narrowband receiver 110 for processing. The feedback signal provided to the narrowband receiver 110 can have approximately the same bandwidth as the amplified RF signal $Z_T$.

In some embodiments, the narrowband receiver 110 is configured to perform diagnostics and/or equalization. Accordingly, the narrowband receiver 110 can be utilized for providing feedback to the DPD adaptation circuit 120 and for diagnostics and/or equalization in such embodiments. According to these embodiments, the narrowband receiver 110 is relatively inexpensive to implement because it is already present for other purposes. The illustrated narrowband receiver 110 also includes an ADC 115 that has a lower sampling rate than a receiver with a Nyquist ADC that observes the whole signal bandwidth. Accordingly, the narrowband receiver 110 can consume less power and hence provide a more efficient DPD solution.

Narrowband receivers for diagnostics and/or equalization can have a bandwidth that is, for example, at least one to two orders of magnitude less than the signal bandwidth. For instance, some narrowband receivers for diagnostics and/or equalization can have a bandwidth of about 6 MHz and feedback signals can have a 1 GHz signal bandwidth in certain applications. It can be desirable, however, to observe most or all of the signal bandwidth of the feedback signal for DPD. Moreover, in some instances, as discussed above, it can be desirable to observe at least about 5 times the signal bandwidth for DPD. As such, a narrowband receiver configured to observe a 6 MHz bandwidth can be about 1000 times too narrow to observe a 1 GHz signal for certain applications.

The narrowband receiver 110 can observe sub-bands of the feedback signal over a frequency of interest and provide narrowband feedback for the DPD adaptation circuit 120. Sub-bands can alternatively be referred to as channels. The frequency of interest can constitute the majority of the signal bandwidth of the feedback signal. Accordingly, the narrowband feedback can span the majority of the signal bandwidth of the wideband signal. As such, the narrowband feedback can be used to observe frequencies of the feedback signal in which non-linear distortions are expected to be present and frequencies of the feedback signal corresponding to the linear region of the power amplifier 150. The narrowband feedback corresponding to frequencies at which non-linear distortions are present can correct for non-linearities, such as intermodulation distortion. The narrowband feedback corresponding to the in band response of the power amplifier 150 can correct for in band errors.

FIG. 1 illustrates an example of a sub-band of the amplified RF signal $Z_T$ that can be observed by the narrowband receiver 110. The narrowband receiver 110 can sweep across a frequency of interest of the feedback signal and provide the DPD adaptation circuit 120 with a narrowband feedback signal ZF that corresponds to different sub-bands that together span the frequency of interest while the narrowband receiver 110 is being swept. Accordingly, the narrowband receiver 110 can provide feedback information regarding the entire frequency of interest, such as the entire signal bandwidth of the amplified RF signal $Z_T$, to the DPD adaptation circuit 120. Then the DPD adaptation circuit 120 can update the predistortion coefficients α provided to the DPD actuator 130 based on the narrowband feedback signal $Z_F$.

The illustrated narrowband receiver 110 includes a channel control circuit 111, a local oscillator 112, a mixer 113, an anti-aliasing filter (AAF) 114, an ADC 115, and a channel filter 116. The channel control circuit 111 can adjust a frequency of an output of the local oscillator 112 that is provided to the mixer 113. Accordingly, the channel control circuit 111 can adjust which portion of the feedback signal provided to the mixer 113 is centered at baseband. The baseband signal provided by the mixer 113 can be filtered by the AAF 114. The output of the AAF 114 can be provided to the ADC 115. The ADC 115 can have a sampling rate on the order of the sub-band of the feedback signal being processed by the narrowband receiver 110. As one non-limiting example, the ADC 115 can have a sampling rate of about 20 MHz when the sub-band being observed by the narrowband receiver 110 has a bandwidth of about 6 MHz. Since the ADC 115 can be the circuit that consumes the most power in the narrowband receiver 110, reducing the sampling rate of the ADC 115 can have a significant impact on the power consumption and efficiency of the communications system 100. The ADC 115 can digitize an analog input and provide a digital output to the channel filter 116. The channel filter 116 can block frequencies outside of the channel being observed by the narrowband receiver 110 and pass the channel being observed. For example, the channel filter can be a low pass filter. The output of the channel filter 116 can be provided to the DPD adaptation circuit 120.

The channel control circuit 111 can adjust the frequency of the local oscillator 112 by the bandwidth of the narrowband receiver 110 to center a different sub-band of the feedback signal at baseband. The different sub-band can then be processed by the narrowband receiver 110 and provided to the DPD adaptation circuit 120 as narrowband feedback signal ZF. The channel control circuit 111 can continue adjusting the frequency of the local oscillator 112 by the bandwidth of the narrowband receiver 110 to process different portions of the feedback signal to observe a frequency of interest of the feedback signal. Such a process can be iterated multiple times until the predistortion coefficients α have settled.

The channel control circuit 111 can adjust the frequency of the local oscillator 112 by any suitable amount for observing the feedback signal for purposes of DPD. For instance, the channel control circuit 111 can adjust the frequency of the local oscillator 112 by approximately the bandwidth of the narrowband receiver 110. According to some other embodiments, sub-bands of the feedback signal observed by the narrowband receiver 110 can overlap. Alternatively or additionally, the channel control circuit 111 can cause the narrowband receiver 110 to observe significant portions of the bandwidth of the feedback signal without observing the entire bandwidth of the feedback signal.

Adjusting the frequency of the local oscillator 112 is a practical way to adjust the channel being observed by the narrowband receiver 110. Accordingly, adjusting the frequency of the local oscillator 112 may be easier and/or more cost effective to implement than other method of adjusting a channel being observed by the narrowband receiver. Other ways of adjusting the observed channel of the feedback signal are possible. For instance, in some other embodiments (not illustrated), a filter, such as the AAF 114, can be adjustable such that a selected channel of the feedback signal can be isolated and provided to the ADC 115. As another example, one filter of a plurality of different filters in parallel can be selected to filter the feedback signal. Any of the functionalities described with reference to the channel control circuit 111 adjusting which sub-band of the feedback signal is being observed by the narrowband receiver can be implemented by other circuits configured to adjust the channel being observed by the narrowband receiver 110.

Systems with Narrowband Receivers for Indirect DPD

Figure 2:
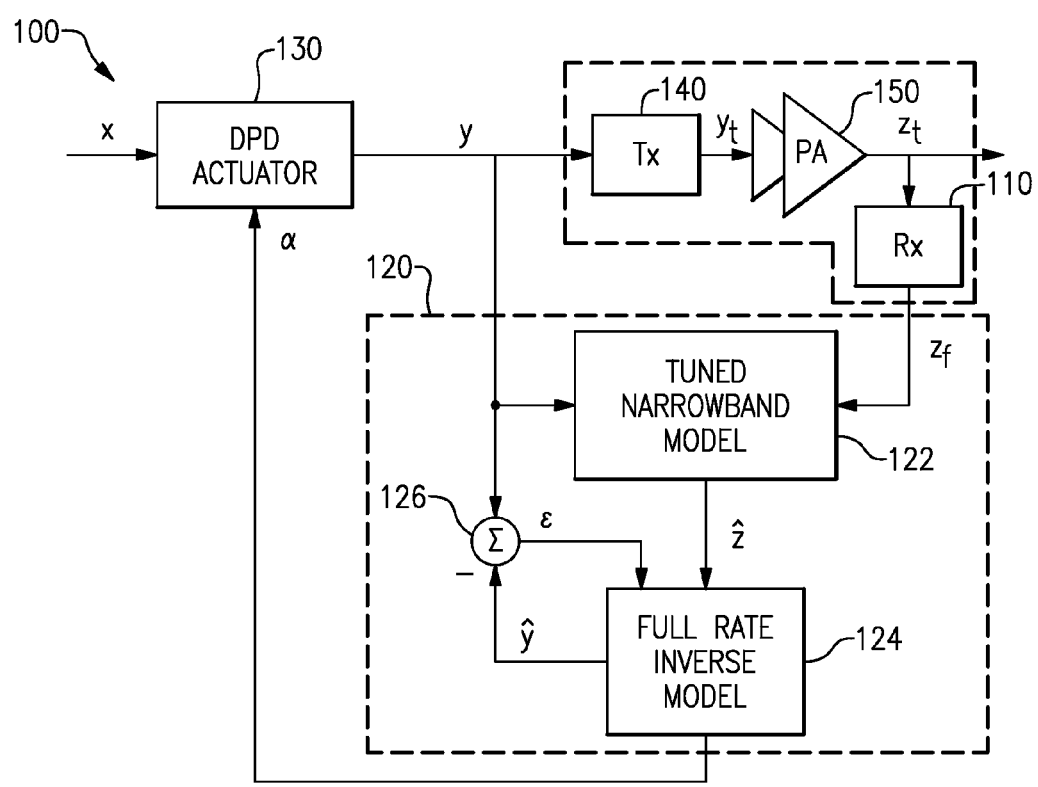
FIG. 2 is a schematic block diagram the communications system of FIG. 1 with an indirect DPD adaptation circuit, according to an embodiment.

With reference to FIG. 2, an embodiment of a DPD system of the communications system 100 will be described. The DPD system of FIG. 2 implements an indirect DPD algorithm. It will be understood that any of the principles and advantages discussed herein may also apply to indirect DPD, such as the indirect DPD algorithms discussed with reference to FIGS. 2 to 5, and/or to direct DPD, such as the direct DPD algorithms discussed with reference to FIGS. 6 and 8 to 10, as appropriate. The illustrated DPD system includes the DPD adaptation circuit 120 and the DPD actuator 130. The DPD adaptation circuit 120 of FIG. 2 includes a tuned narrowband model circuit 122, a full rate inverse model circuit 124, and a comparison circuit 126. The tuned narrowband model circuit 122 can receive the narrowband feedback $Z_F$ and also receive the predistorted input Y from the DPD actuator 130.

The tuned narrowband model circuit 122 can generate an inverse power amplifier model for the sub-band of the feedback signal being observed by the narrowband receiver 110 based on the narrowband feedback $Z_F$ and the predistorted input Y. As different sub-bands of the feedback signal are observed, the tuned narrowband model circuit 122 can update the narrowband model for each sub-band. The tuned narrowband model circuit 122 can generate a virtual full rate model response $\hat{z}$ for the power amplifier 150. The virtual full rate model response $\hat{z}$ can have a bandwidth approximately equal to the bandwidth of the amplified RF signal $Z_F$. The virtual full rate model response can be provided to the full rate inverse model circuit 124.

The full rate inverse model circuit 124 can update the predistortion coefficients α based on an indication of the error ε between the output Y of the DPD actuator 130 and the virtual full rate model response $\hat{z}$. The full rate inverse model circuit 124 can generate a full rate model $\hat{Y}$ from which to generate the predistortion coefficients α, which are provided to the DPD actuator 130. The full rate inverse model circuit 124 can also provide the full rate model $\hat{Y}$ to the comparison circuit 126 to determine an error signal ε. The comparison circuit 126 can generate the error signal ε by comparing the output Y of the DPD actuator 130 with the full rate model $\hat{Y}$. For instance, the comparison circuit 126 can subtract the full rate model $\hat{Y}$ from the output Y. Any difference between the output Y of the DPD actuator 130 and the full rate model $\hat{Y}$ can indicate that the DPD applied to the input signal X can be adjusted to further improve linearity and/or efficiency of the power amplifier 150.

Figure 3:
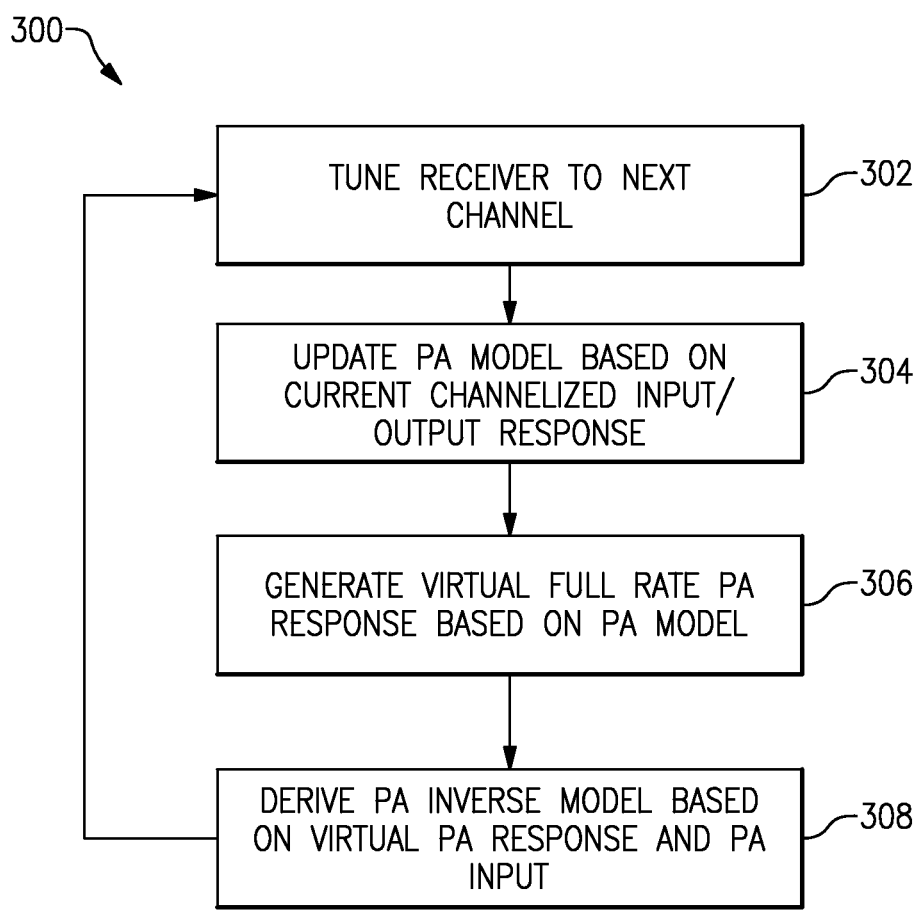
FIG. 3 is a flow diagram of an illustrative process of digitally predistorting an input signal based on narrowband feedback to provide a predistorted signal, according to an embodiment.

FIG. 3 is a flow diagram of an illustrative process 300 of digitally predistorting an input signal to provide a predistorted signal. Any combination of the features of the process 300 or any of the other processes described herein may be embodied in instructions stored in a non-transitory computer readable medium. When executed, the instructions may cause some or all of any of such processes to be performed. It will be understood that any of the methods discussed herein may include greater or fewer operations than illustrated in flow diagram and the operations may be performed in any order, as appropriate. The process 300 can be performed, for example, using the communications system 100 of FIG. 2.

The illustrated process 300 includes tuning a receiver to observe the next channel of a feedback signal at block 302. For instance, the channel control circuit 111 of FIG. 1 can adjust the frequency of the local oscillator 112 to tune the narrowband receiver 110 to observe the next channel of the feedback signal. At block 304, a model for the channel being observed can be updated based on the channelized input/output response of a non-linear circuit. For instance, the model can be a power amplifier model for the power amplifier 150 of FIG. 2.

Then the DPD applied to the input signal can be updated. For example, the predistortion coefficients α provided to the DPD actuator 130 of FIGS. 1 and/or 2 can be updated. This can involve generating a virtual full rate model based on the power amplifier model for the channel being observed by the receiver at block 306. Next, the inverse model can be derived based on the virtual full rate model and the predistorted input signal Y at block 308. The process 300 can be iterated until the inverse model is stable. For instance, the process can involve adjusting the observed channel though a bandwidth of interest multiple times until the inverse model has settled.

Figure 4:
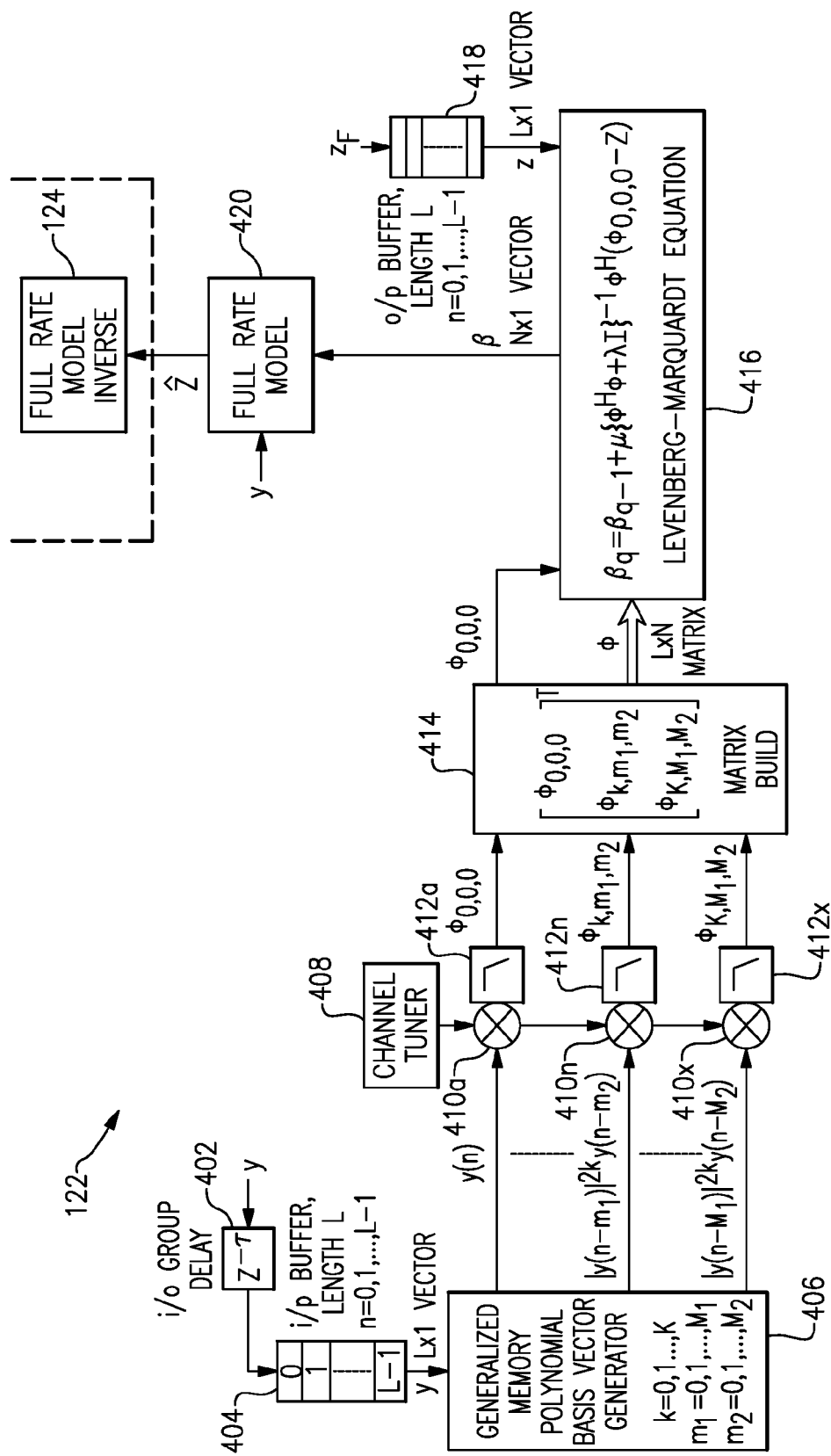
FIG. 4 is a schematic block diagram of a tuned narrowband amplifier modeling engine, according to an embodiment.

With reference to FIG. 4, an illustrative tuned narrowband model circuit 122 will be described. Each block illustrated in FIG. 4 can be implemented by any suitable circuit, such as a combinational logic circuit, an application specific integrated circuit (ASIC), a digital signal processor, or the like. The tuned narrowband model circuit 122 shown in FIG. 4 is one embodiment of the narrowband model circuit 122 of FIG. 2. The tuned narrowband model circuit 122 receives a full rate predistorted input signal Y output from the DPD actuator 130. A delay circuit 402 can delay the predistorted input signal Y. This delay can align the predistorted input signal Y with the corresponding narrowband feedback in time. The delayed predistorted signal is buffered by an input buffer 404. The input buffer 404 can store any suitable number of signals. The input buffer 404 can store on the order of 1000 entries, such as about 5000 entries. A basis vector generator circuit 406 can generate basis vectors from an input provided by the input buffer 404. The basis vectors can correspond to the entire signal bandwidth of the amplified RF signal $Z_T$.

A channel tuner 408 can tune the frequency of signals provided to the mixers 410a to 410x. For instance, the channel tuner 408 can include a local oscillator having an adjustable frequency. The mixers 410a to 410x can translate the basis vector such that a selected frequency is centered at baseband. The translated basis vectors can then be filtered by filters 412a to 412x to isolate the channel of the predistorted input Y that corresponds to the channel of the amplified RF signal $Z_T$ being observed by the narrowband receiver 110. The filters 412a to 412x can be digital low pass filters as illustrated. As shown in FIG. 4, there can be one mixer 410 and one filter 412 for each basis vector according to certain embodiments. According to some other embodiments, the illustrated mixers 410a to 410x can be implemented as a single mixer and the filters 412a to 412x can be implemented by a single filter. Other methods of isolating the channel of the predistorted input Y corresponding to the channel of the amplified RF signal $Z_T$ being observed by the narrowband receiver 110 can alternatively be implemented, such as adjusting the pass band of the filters 412a to 412x in place of or in combination with changing the frequency of a signal provided to the mixers 410a to 410x.

The channel tuner 408, the mixers 410a to 410x, and the filters 412a to 412x can together isolate the frequency component of the model of the predistorted input Y corresponding to the observed channel of the amplified RF signal $Z_T$ being observed by the narrowband receiver 110. Accordingly, the power amplifier model can be built from corresponding channels of the model of predistorted input Y and narrowband feedback from the amplified RF signal $Z_T$.

A matrix build circuit 414 can generate a matrix from the outputs of the filters 412a to 412x. This matrix can be used to update the model update coefficients. An update circuit 416 can implement an update equation to update the update coefficients β to update of the virtual full rate model response ẑ. The update circuit 416 can receive the matrix from the matrix build circuit 414 and also receive narrowband feedback from an output buffer 418. The narrowband feedback $Z_F$ provided by the narrowband receiver 110 can be buffered by the output buffer 418. The output buffer 418 can store a number of entries corresponding to the number of entries stored by the input buffer 404. The output buffer 418 can provide a narrowband feedback vector of narrowband feedback to the update circuit 416. The update circuit 416 can compute update coefficients β to update the virtual full rate model response ẑ from the narrowband feedback vector and data provided by the matrix build circuit 414.

The narrowband feedback $Z_F$ provided to the tuned narrowband model circuit 122 of FIG. 4 is a narrowband signal. Accordingly, the narrowband feedback 4 can be processed differently than full band feedback. The tuned narrowband model circuit 122 can generate a full model of the power amplifier from the narrowband feedback $Z_F$ to produce the model coefficients β. A full rate model circuit 420 can use the coefficients β to synthesize the virtual full rate model response ẑ. The illustrated virtual full rate model response ẑ is a full rate, full bandwidth estimate of the power amplifier model output that can be based on the virtual full rate model response ẑ and the predistorted input signal Y. While the model coefficients β may be based only one narrowband feedback $Z_F$ corresponding to an isolated sub-band of the signal bandwidth of the amplified RF signal $Z_T$, the virtual full rate model response ẑ can be based on the narrowband feedback $Z_F$ corresponding to a bandwidth of interest (e.g., most or all of the signal bandwidth) of the amplified RF signal $Z_T$.

The virtual full rate model response ẑ can be a substitute for a power amplifier response as observed by a DPD receiver that observes a full signal bandwidth of the power amplifier output in a conventional DPD solution. The full rate inverse circuit 124 can implement inverse power amplifier modeling to generate predistortion coefficients α for the DPD actuator 130. The full rate inverse circuit 124 generates the predistortion coefficients α based on the virtual full rate model response ẑ.

The update equation can be any suitable equation to generate update coefficients β to update the virtual full rate model response ẑ from the narrowband feedback vector and the matrix from the matrix build circuit 414. As illustrated, the update equation can be a Levenberg-Marquardt equation. The update equation can be any other suitable iterative estimation equation.

The update coefficients β and/or the updated virtual full rate model response ẑ can be provided to the full rate inverse model circuit 124. The full rate inverse model circuit 124 can then generate updated predistortion coefficients α for the DPD actuator 130 based on the output of the update circuit 416.

Figure 5A:
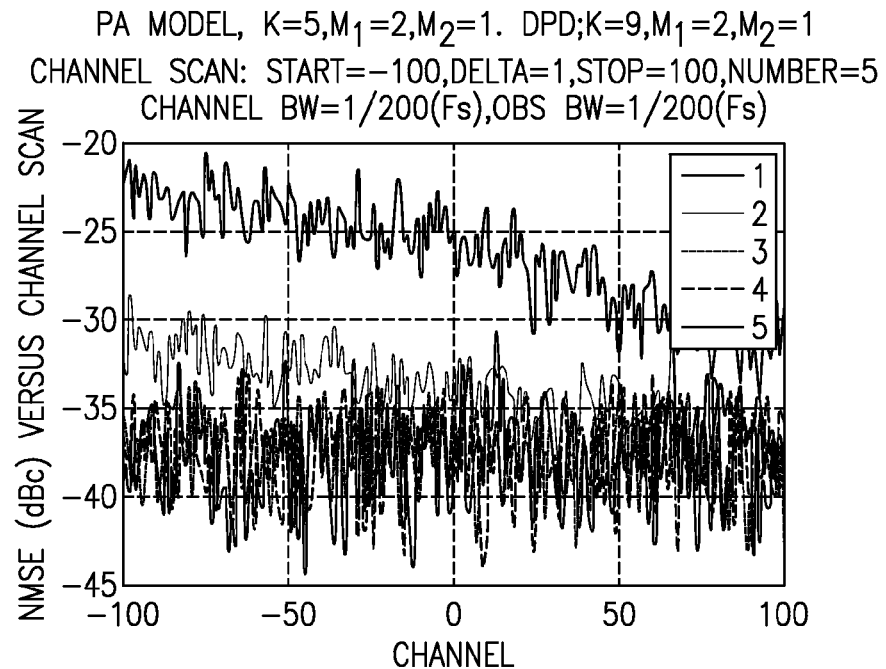
FIG. 5A is a graph illustrating a relationship between normalized mean squared error (NMSE) and channels of an amplified RF signal in accordance with the embodiments of FIGS. 2 and 3.

FIG. 5A is a graph illustrating a relationship between normalized mean squared error (NMSE) and channels of the amplified RF signal $Z_T$ in an embodiment of the communications system 100. As shown in FIG. 5A, the NMSE can converge after the narrowband receiver 110 sweeps though the illustrated channels of the amplified RF signal $Z_T$ about 4 times. Accordingly, it can be desirable for the narrowband receiver 110 to observe channels of a bandwidth of interest of the amplified RF signal $Z_T$ more than once for the DPD solution to converge.

There can be a tradeoff between convergence time and observed bandwidth of the receiver for DPD. Relatively narrower observation bandwidths in the narrowband receiver 110 can lead to a longer convergence time than relatively wider observation bandwidths. In certain applications, a longer convergence time can be tolerated. For instance, in applications with relatively stable environmental conditions, longer convergence time can be tolerated and may not need much adjusting after initially settling. Some such example applications include applications where power amplifier heating and/or cooling are the most significant contributors to non-linear distortion, fixed/stationary applications, cable transmitter applications, the like, or any combination thereof. Observed receiver bandwidth can be increased to reduce convergence time if desired. Alternatively or additionally, a plurality of narrowband receivers 110 can be implemented in parallel to observe different channels to reduce convergence time.

Figure 5B:
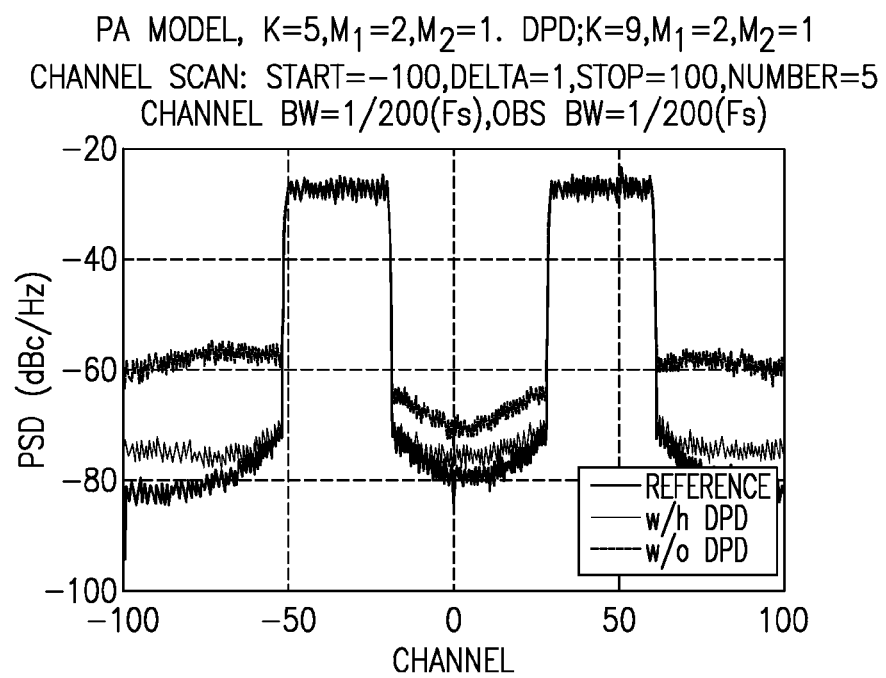
FIG. 5B is a graph illustrating a comparison between phase noise of a desired reference signal, phase noise of a power amplifier output signal with DPD as implemented by a DPD system in accordance with the embodiments of FIGS. 2 and 3, and phase noise of a corresponding power amplifier output signal without DPD.

FIG. 5B is a graph illustrating a comparison between signal power spectral density (PSD) of a desired reference signal, PSD of a power amplifier output signal with DPD as implemented by a DPD system in accordance with the embodiments of FIGS. 2 and 3, and PSD of a corresponding power amplifier output signal without DPD. The phase noise in FIG. 5B is represented by noise power relative to a carrier in a 1 Hz bandwidth centered at certain offsets from the carrier. The graph in FIG. 5B, along with the graph in FIG. 5A, shows that tuned narrowband DPD is feasible in accordance with the embodiments with indirect DPD discussed herein.

Systems with Narrowband Receivers for Direct DPD

Figure 6:
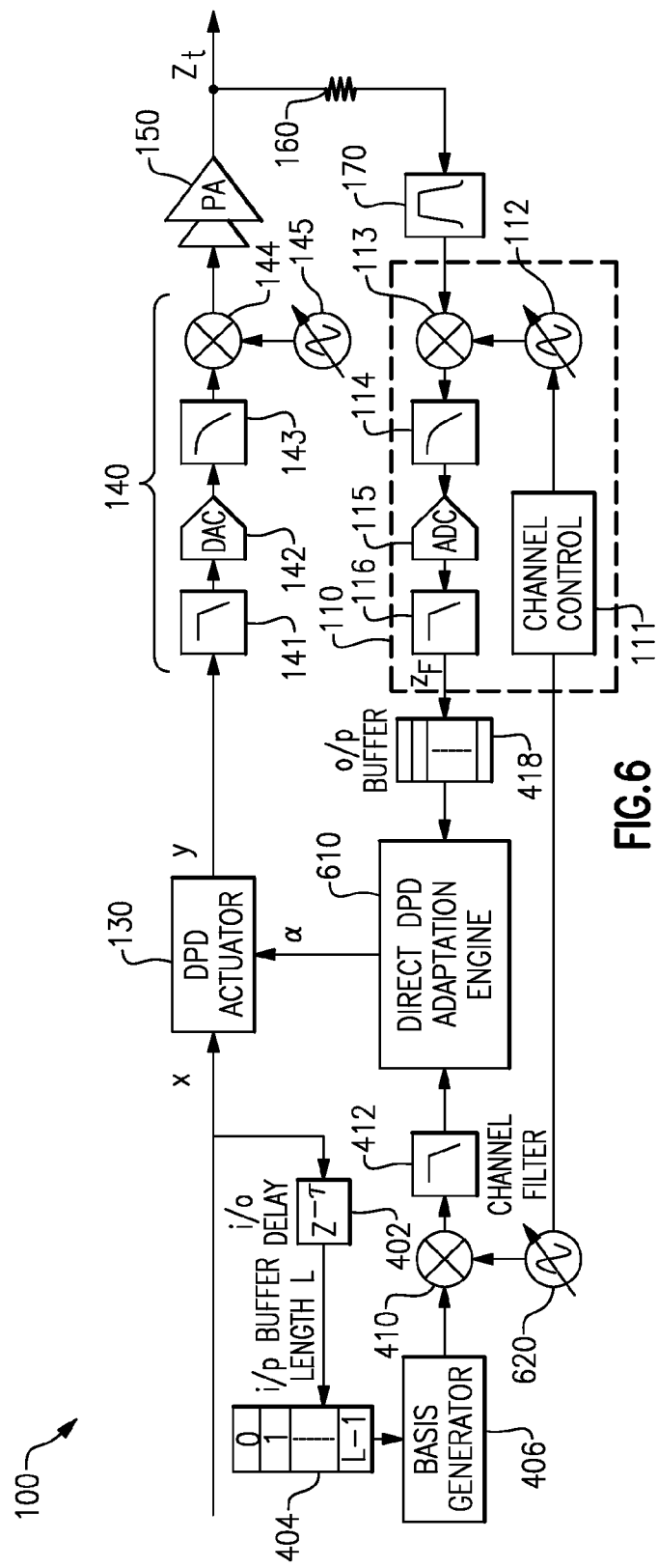
FIG. 6 is a schematic block diagram of the communications system of FIG. 1 with a direct DPD adaptation circuit, according to an embodiment.

Referring to FIG. 6, a schematic block diagram of an embodiment of the communications system 100 with a direct DPD adaptation engine 610 will be described. Elements that are substantially the same or functionally similar to one or more of the embodiments described above are numbered similarly in FIG. 6. For instance, the principles and advantages of the narrowband receiver 110 described with reference to FIG. 1 and the embodiments of FIGS. 2 to 5B related to indirect DPD can be implemented in the context of direct DPD. With the direct DPD adaptation engine 610, DPD can be directly trained. As such, DPD can be implemented without an intermediate operation of power amplifier model fitting. In the direct narrowband DPD of FIG. 6, DPD is implemented without an intermediate operation of model fitting.

In the illustrated communications system 100 of FIG. 6, the input signal X received by the DPD actuator 130 can be processed instead of the predistorted input signal Y for purposes of generating a basis vector. The input signal X can be delayed by the delay circuit 402 and buffered by the input buffer 404. The output of the input buffer 404 can be provided to the basis vector generator circuit 406 to generate the basis vector.

The basis vector can be tuned to a channel corresponding to the channel of the narrowband feedback $Z_F$ from the narrowband receiver 110. As illustrated, the frequency of a local oscillator 620 can be adjusted by the channel control circuit 111. The channel control circuit 111 can implement any combination of features discussed above, for example, with reference to FIG. 1. The basis vector can then be upconverted by the mixer 410 and filtered by the filter 412 to isolate the channel of the basis vector corresponding to the channel of the narrowband feedback $Z_F$. The direct DPD adaptation engine 610 can generate predistortion coefficients α from the narrowband feedback $Z_F$ and the output of the channel filter 412. Accordingly, in the direct DPD of FIG. 6, the predistortion coefficients α can be computed without deriving a power amplifier model and inverting the power amplifier model. Instead, the predistortion coefficients α can be derived from the narrowband feedback $Z_F$ and the corresponding isolated channel of the basis vector.

Figure 7A:
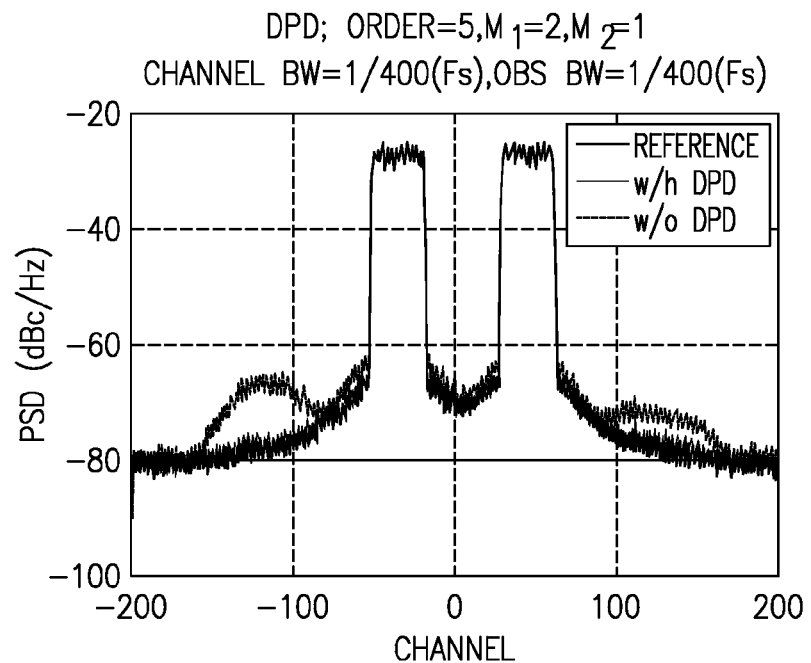
FIGS. 7A and 7B are graphs illustrating simulation results of DPD in the communications system of FIG. 6.
Figure 7B:
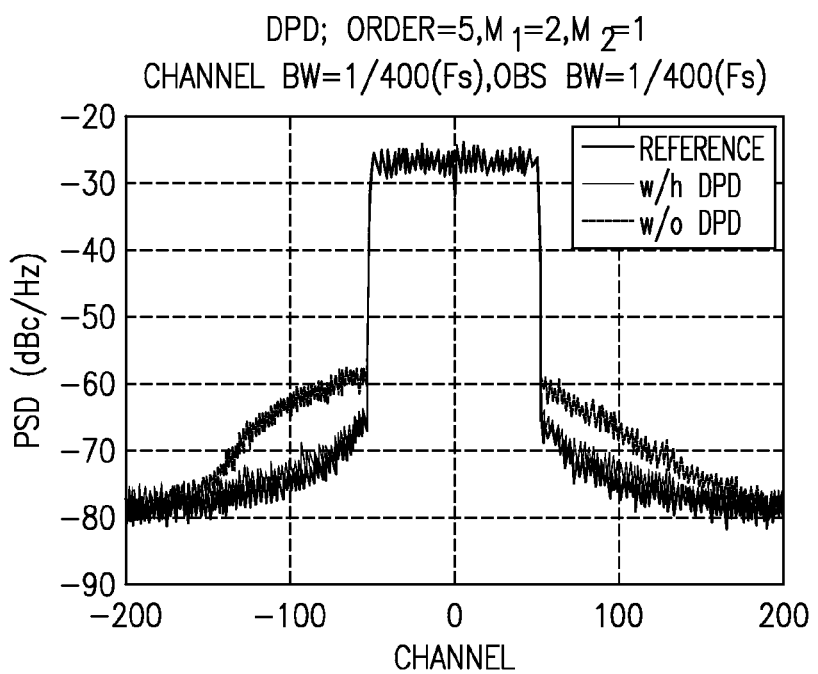

FIGS. 7A and 7B are graphs illustrating simulation results of the communications system 100 of FIG. 6. These graphs illustrate comparisons between PSD of a desired reference signal, PSD of a power amplifier output signal with direct DPD as implemented by the communications system of FIG. 6, and PSD of a corresponding power amplifier output signal without DPD. These graphs show that DPD with a tuned narrowband receiver and direct DPD adaptation can reduce non-linearity in a power amplifier output.

Figure 8:
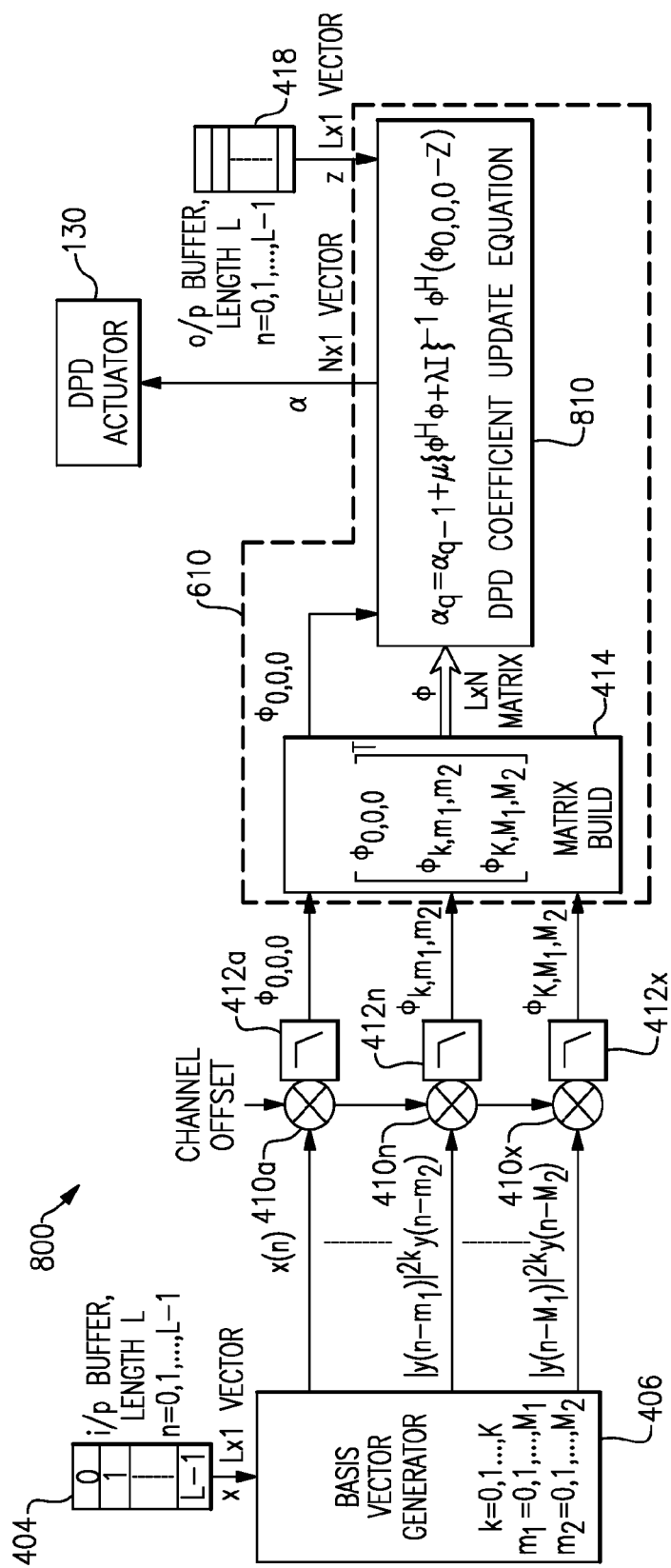
FIG. 8 illustrates a direct DPD adaptation engine, according to an embodiment.

With reference to FIG. 8, an illustrative direct DPD adaptation circuit 800 will be described. The direct DPD adaptation circuit 800 can implement the direct DPD adaptation engine 610 and other associated circuitry of the communications system 100 of FIG. 6. The DPD adaptation circuit 800 is functionally similar to the tuned narrowband model circuit 122 of FIG. 4. The direct DPD adaptation circuit 800 is configured to receive the input signal X provided to the DPD actuator 130 (for example, as shown in FIG. 6), while the tuned narrowband model circuit 122 of FIG. 4 is configured to receive the predistorted input signal Y. The direct DPD adaptation circuit 800 can compute the predistortion coefficients α directly. As illustrated, the DPD coefficient update circuit 810 can compute the predistortion coefficients α from the matrix provided by the matrix build circuit 414 and the data from the output buffer 418, instead computing the update coefficients β for the virtual full rate model response $\hat{z}$. Accordingly, the direct DPD adaptation circuit 800 can compute the predistortion coefficients α without generating a virtual full rate model response $\hat{z}$ or using a full rate model inverse circuit.

The DPD coefficient update circuit 810 can implement any suitable DPD update equation, such as the Levenberg-Marquardt algorithm or another suitable iterative estimation algorithm. In the example equation provided in FIG. 8, q can represent the $q^{th}$ iteration of the update equation, m>0 can represent a damping factor (scalar) to control convergence, l>0 can represent a regularization factor (scalar) to control over fitting or/and numerical issues. The DPD coefficient update circuit 810 can compute the predistortion coefficients α offline using buffered input/output data.

Figure 9:
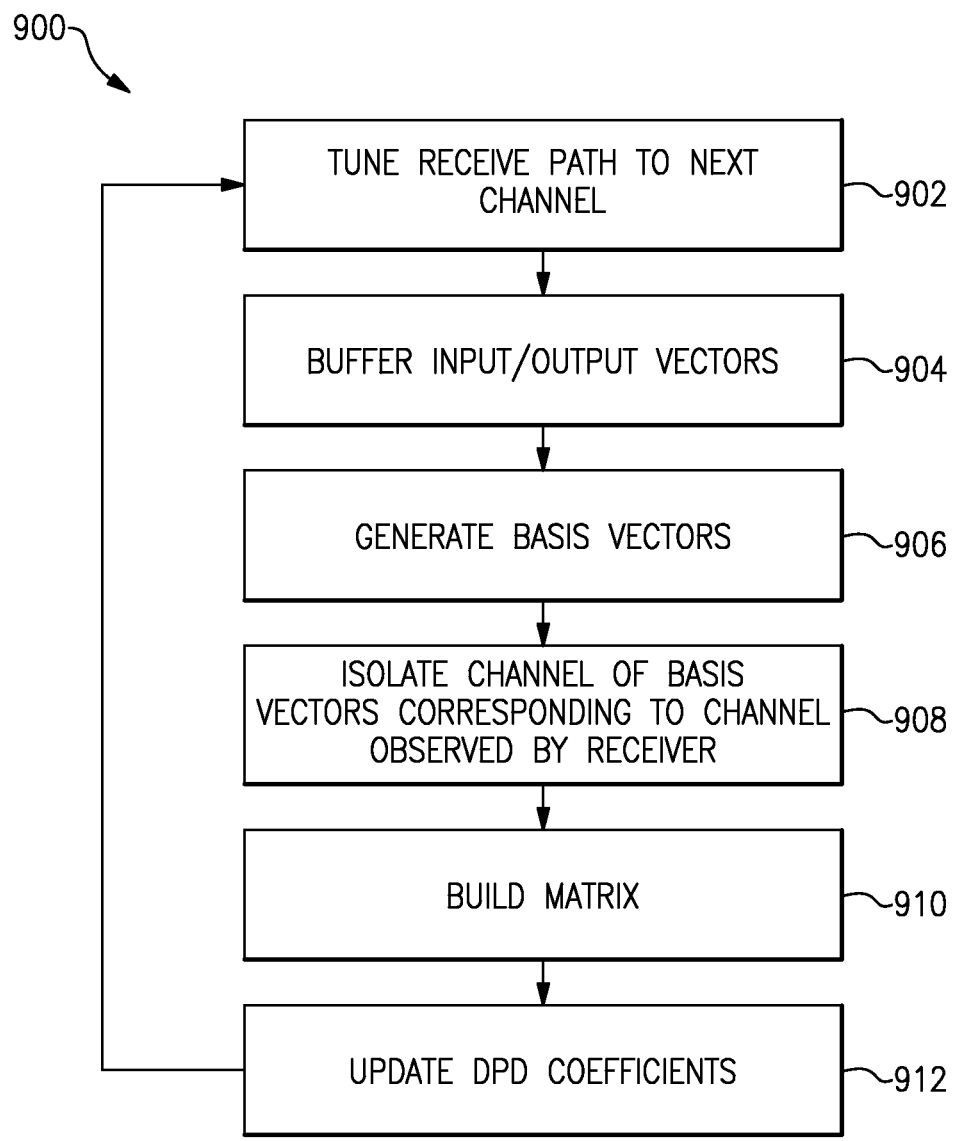
FIG. 9 is a flow diagram of an illustrative process of updating digital predistortion coefficients with direct DPD adaptation, according to an embodiment.

FIG. 9 is a flow diagram of an illustrative process 900 of updating digital predistortion coefficients using direct DPD adaptation according to an embodiment. The process 900 can be performed, for example, using the communications system 100 of FIG. 6 and/or the DPD adaptation circuit 800 of FIG. 8. The process 900 implements an adaptation algorithm for direct DPD.

The illustrated process 900 includes tuning a receiver to observe the next channel of a feedback signal at block 902. For instance, the channel control circuit 111 of FIG. 6 can adjust the frequency of the local oscillator 112 to tune the narrowband receiver 110 to observe the next channel of the feedback signal. The tuning at block 902 can implement any combination of features described with reference to tuning the narrowband receiver 110 discussed herein.

The input for the transmit path and the feedback can then be processed for updating DPD coefficients. At block 904, input/output vectors can be buffered. For instance, the input buffer 404 of FIG. 6 can buffer the input signal X. In addition, the narrowband feedback $Z_F$ can be buffered by the output buffer 418 of FIG. 6. The buffered input and/or output vectors can be L×1 vectors, in which L is the number of samples stored in the buffer. As one non-limiting example, L can be on the order of 1000 (for example, 5000). There can be the same number of samples in the input and output vectors. Basis vectors can be generated at block 906. For instance, the basis vector generator circuit 406 of FIG. 6 can generate N basis vectors from the input vector provided by the input buffer 404, in which N is a positive integer. At block 908, the channel of the basis vectors corresponding to the channel observed by the receiver can be isolated. This can involve, for example, digitally downconverting each basis vector such that the same channel as the channel being observed by the narrowband receiver 110 is translated to baseband and low pass filtered. Then a matrix can be built at block 910. The matrix can be an L×N matrix. The matrix can be provided to a DPD coefficient update circuit, such as the DPD coefficient update circuit 810 of FIG. 6.

At block 912, the DPD coefficients can be updated. The DPD coefficient update circuit can update the DPD coefficients from the L×N matrix generated at block 910 and the buffered output vector buffered at block 904. The DPD coefficients can be updated in accordance with the direct DPD coefficient updating described with reference to FIG. 6. The DPD coefficients can be computed offline.

After the DPD coefficients have been updated, the process 900 can return to block 902. The process 900 can sweep through a bandwidth of interest of the amplified RF signal $Z_T$ and update the predistortion coefficients α for each observed channel of the bandwidth of interest. As discussed above, in some embodiments, the bandwidth of interest can be swept through multiple times until the predistortion coefficients α converge.

Observing a relatively narrow bandwidth of the amplified RF signal $Z_T$ can result in a longer convergence time for non-linear distortions in the amplified RF signal $Z_T$ to be reduced to a desired level. In some applications, multiple scans across a bandwidth of interest can train DPD in order to reduce non-linear distortions to the desired level. The adaptation duty cycle of DPD can be longer than an equivalent solution that observes a relatively wider bandwidth of the amplified RF signal $Z_T$.

Figure 10:
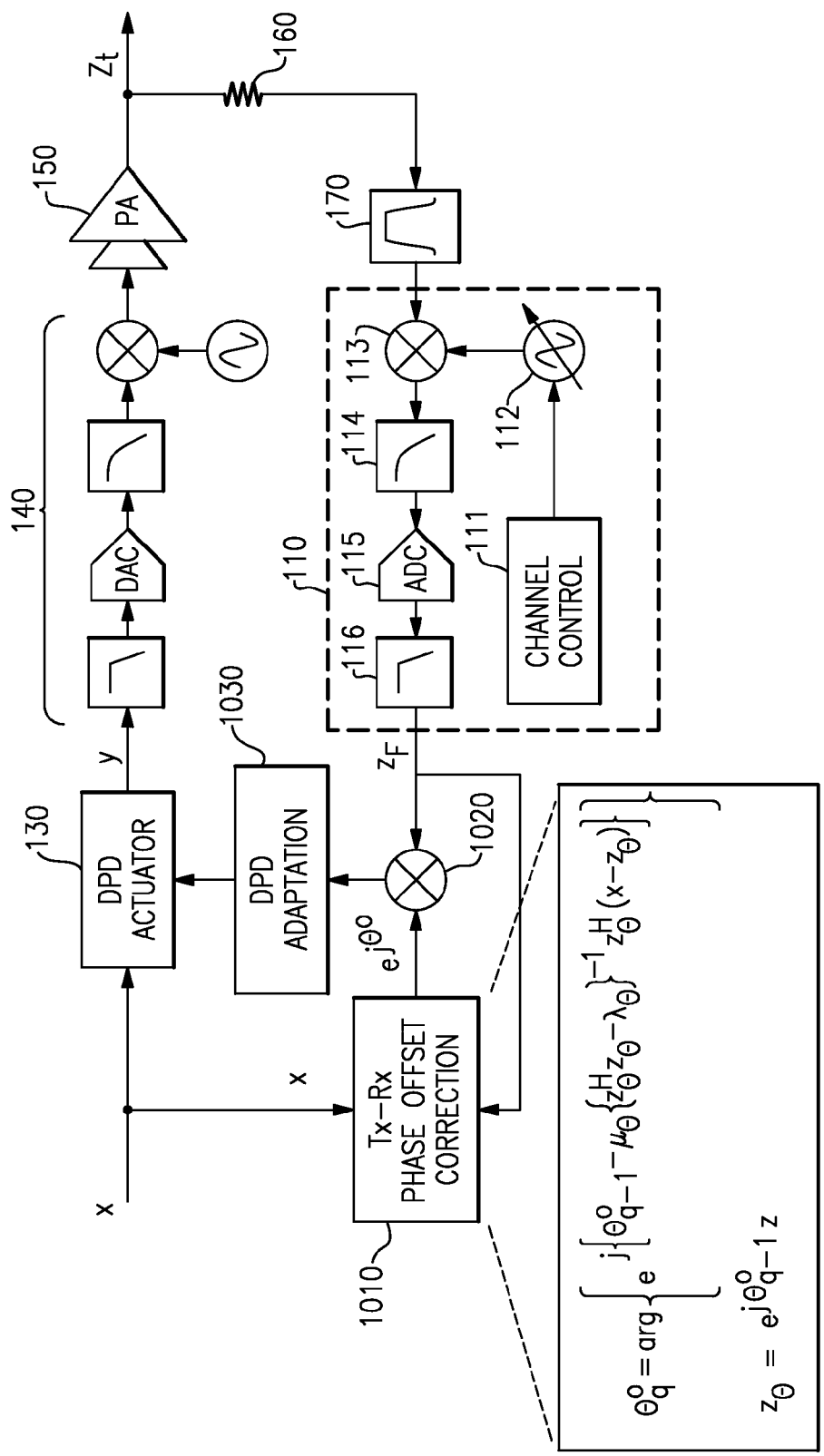
FIG. 10 illustrates a communications system with direct DPD adaptation that implements phase offset correction, according to an embodiment.

Direct DPD adaptation can experience problems, and even failures, when transmit and receive local oscillators are not locked in phase. Accordingly, phase offset correction can be implemented to reduce and/or eliminate phase offsets between transmit and receive signals. FIG. 10 illustrates an embodiment of a communications system 100 that implements phase offset correction. In the communications system 100 of FIG. 10, a phase offset correction circuit 1010 can generate a phase offset correction signal based on the input signal X and the narrowband feedback signal $Z_F$. The phase offset correction circuit 1010 can estimate a phase difference between the input signal X and the narrowband feedback signal $Z_F$, for example, using the equations shown in FIG. 10. The phase offset correction signal can be provided to a phase offset correction mixer 1020. The phase offset correction mixer 1020 can cause the phases of the input signal X and the narrowband feedback $Z_F$ to be aligned. As illustrated, the phase offset correction mixer can adjust the phase of the narrowband feedback signal $Z_F$ so that this phase aligns with the phase of the input signal X. Alternatively, the phase offset correction mixer 1020 can adjust the phase of the input signal X so that this phase aligns with the phase of the narrowband feedback signal $Z_F$. A phase offset corrected signal from the phase offset correction mixer 1020 can be provided to the DPD adaptation circuit 1030 and DPD adaptation algorithms can be applied to signals that are aligned in phase.

Systems with Sub-Nyquist ADC in Receiver for DPD

As discussed above, in certain applications, an ADC in a receiver can have the most significant contribution to power consumption in a feedback path for DPD. The embodiments discussed with reference to FIGS. 1 to 10 relate to using narrowband receivers to observe a relatively narrow sub-band of a feedback signal. Processing a narrowband signal is one way to reduce power consumption of the ADC in the receiver, as the narrowband signal can have a small fraction of the bandwidth of the feedback signal and the ADC in the receiver can have a relatively low sampling rate compared to a Nyquist sampling rate for the feedback signal. For example, the ADC can have a sampling rate that is at least about 5 times less than the signal bandwidth of the feedback signal, 10 times less than the signal bandwidth of the feedback signal, 20 times less than the signal bandwidth of the feedback signal, 100 times less than the signal bandwidth of the feedback signal, 1000 times less than the signal bandwidth of the feedback signal, or 5000 times less than the signal bandwidth of the feedback signal.

Another way to reduce the power consumption of the DPD receiver is to reduce the sampling rate of the ADC to a sub-Nyquist rate while providing the ADC with an input having the full signal bandwidth of the amplified RF signal $Z_T$. The power consumption of the DPD receiver can also be reduced by reducing the sampling rate of the ADC to a sub-Nyquist rate relative to a narrowband signal corresponding to an isolated sub-band of the signal bandwidth of the amplified RF signal $Z_T$. Conventionally, using a sub-Nyquist ADC was been avoided because sampling at a sub-Nyquist rate should result in alias distortion. The embodiments discussed with reference to FIGS. 11 to 15 relate to DPD receivers with sub-Nyquist ADCs that can train DPD in the presence of alias distortion. Any of the principles and advantages discussed with reference to FIGS. 11 to 15 can be applied to at least the embodiments discussed with reference to FIGS. 1 to 5B.

Figure 11:
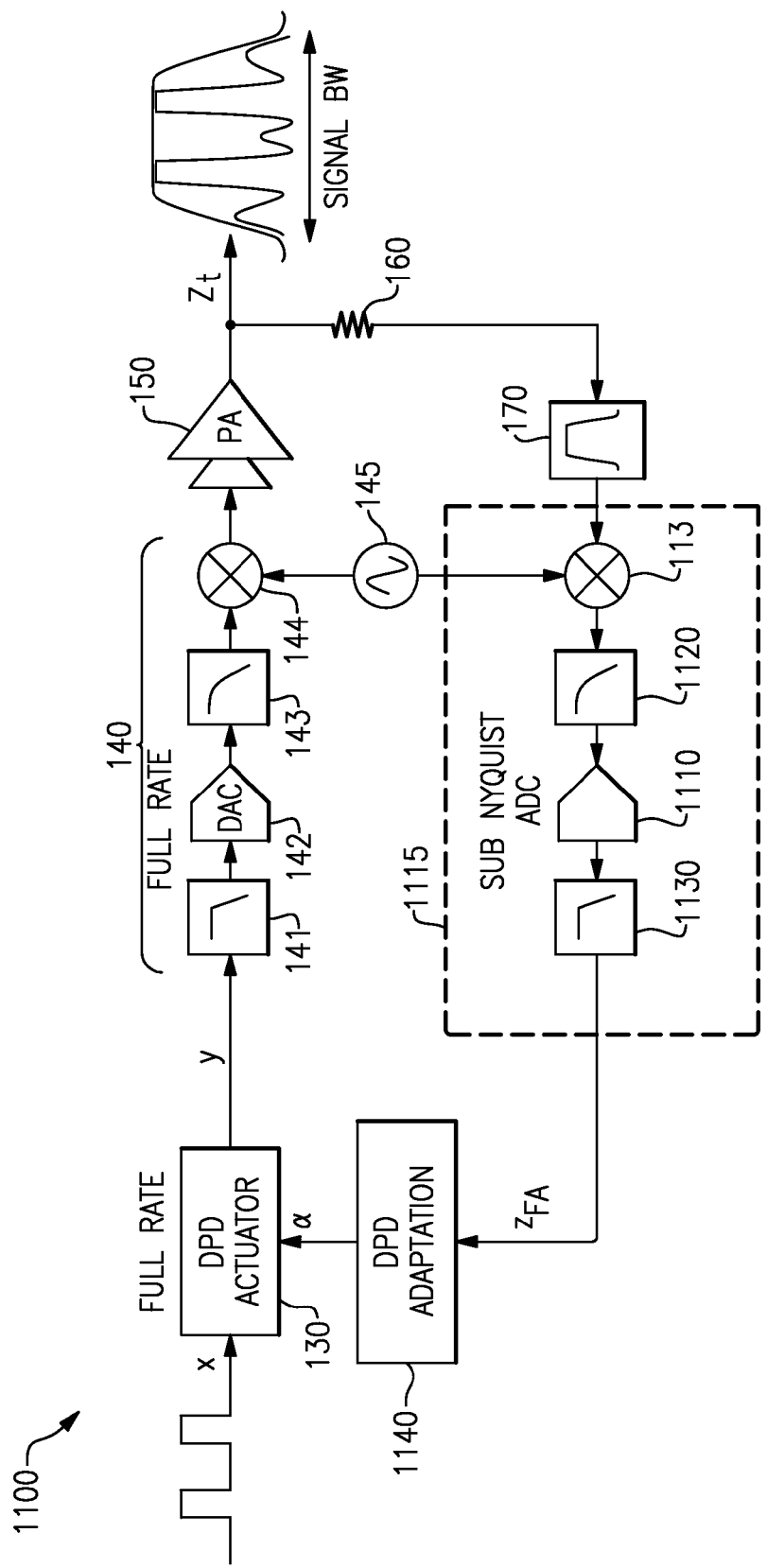
FIG. 11 is a schematic block diagram of a communications system with a sub-Nyquist analog-to-digital converter in the receiver, according to an embodiment.

With reference to FIG. 11, an embodiment of a communications system 1100 with a sub-Nyquist ADC 1110 in a receiver 1115 will be described. Elements that are substantially the same or functionally similar to one or more of the embodiments described above are numbered similarly in FIG. 11.

In the communications system 1100, the receiver 1115 can observe the full signal bandwidth of the amplified RF signal $Z_T$ and/or any isolated sub-band thereof. For instance, when the amplified RF signal $Z_T$ has a 1 GHz signal bandwidth, the receiver 1115 can observe a 1 GHz bandwidth when observing the full signal bandwidth. It will be understood that the receiver 1115 can observe any bandwidth of interest, which can be less than the full signal bandwidth in certain embodiments. The mixer 113 in the receiver 1115 can be coupled to the same local oscillator 145 as the transmitter. As such, the mixer 113 can downconvert the feedback signal by approximately the same amount as the mixer 144 in the transmit path upconverts its input. Using the same local oscillator 145 for the transmitter 140 and the receiver 1115 can keep these paths in phase. An analog filter 1120 can pass a bandwidth corresponding to the bandwidth as the amplified RF signal $Z_T$. Accordingly, the sub-Nyquist ADC 1110 can receive an input having a signal bandwidth that is approximately the same as the signal bandwidth of the amplified RF signal $Z_T$.

The sub-Nyquist ADC 1110 can sample its input at a sub-Nyquist rate. For instance, according to certain embodiments, the bandwidth of the sub-Nyquist ADC 1110 can be on the at least 10 times, or even at least 100 times or at least 1000 times, smaller than the Nyquist rate of the amplified RF signal $Z_T$. The output of the sub-Nyquist ADC 1110 can include alias distortion due to sampling at a sub-Nyquist rate. The output of the sub-Nyquist ADC 1110 can be filtered by a digital filter 1130. The digital filter 1130 can have a pass band that passes a signal bandwidth of corresponding to the signal bandwidth of the amplified RF signal $Z_T$. The receiver 1115 can provided an aliased feedback signal $Z_{FA}$ to a DPD adaptation circuit 1140. The DPD adaptation circuit 1140 can adjust predistortion coefficients $\alpha$ based on the aliased feedback signal $Z_{FA}$.

Simulation data indicate that DPD converges with the sub-Nyquist ADC 1110 in the receiver. Aliasing can have a broadening or whitening effect at higher decimation rates, and intermodulation distortion and linear content can get folder on top of each other across the frequency spectrum. Convergence time and variance of estimation can generally increase as a decimation factor of the ADC 1110 increases. Given sufficient time, arbitrary levels of aliasing introduced by the sub-Nyquist ADC 1110 can be tolerated. Simulation data indicate that a decimation factor of 20 or less for the ADC 1110 can result in a relatively fast DPD convergence in certain applications. For instance, a relatively fast convergence was observed in simulations of a communications system in accordance with FIGS. 11 to 12B for decimation factors of 2, 10, and 20. Larger decimation factors (e.g., 50, 100, 200, 1000, or more) can be implemented when a longer speed of convergence can be tolerated.

Figure 12A:
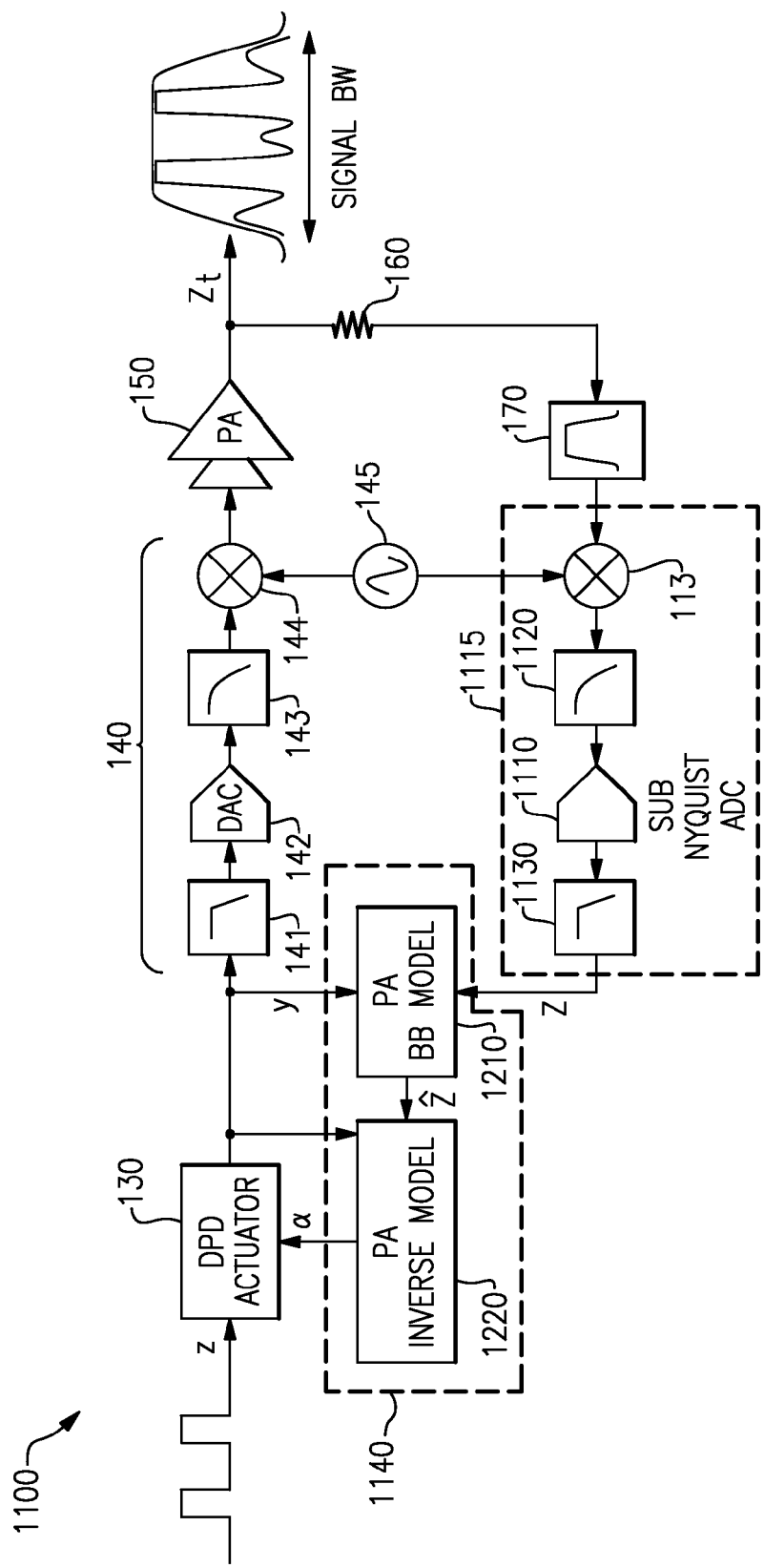
FIG. 12A illustrates an embodiment of the communications system of FIG. 6 in which the DPD adaptation circuit includes a power amplifier model circuit and a power amplifier inverse model circuit.

FIG. 12A illustrates an embodiment of the communications system 1100 in which the DPD adaptation circuit 1140 includes a power amplifier model circuit 1210 and a power amplifier inverse model circuit 1220. The power amplifier modeling in the communications system 1100 of FIG. 12A can be performed in the presence of alias distortion. The communications system 1100 of FIG. 12A implements a two-step DPD derivation. A full rate model can be generated using a sub-Nyquist input/output data and then an inverse model can be generated. First, the power amplifier model circuit 1210 can extract a power amplifier model. The power amplifier model can be a baseband model. The power amplifier model can be extracted from the predistorted input signal Y and the aliased feedback signal $Z_{FA}$. Accordingly, the power amplifier model can be extracted from a sub-Nyquist sampled signal. After the power amplifier model is extracted, the power amplifier inverse model circuit 1220 can derive updated predistortion coefficients $\alpha$ and provide the predistortion coefficients $\alpha$ to the DPD actuator 130. As illustrated, the power amplifier inverse model circuit 1220 can derive the predistortion coefficients $\alpha$ from the power amplifier model provided by the power amplifier model circuit 1210. The power amplifier inverse model circuit 1220 can invert the power amplifier model at full rate. The power amplifier inverse model circuit 1220 can implement any suitable inversion algorithm. The power amplifier inverse model circuit 1220 can generate a baseband inverse power amplifier model. The power amplifier inverse model circuit 1220 can control the DPD actuator 130 based on the inverse power amplifier model.

Figure 12B:
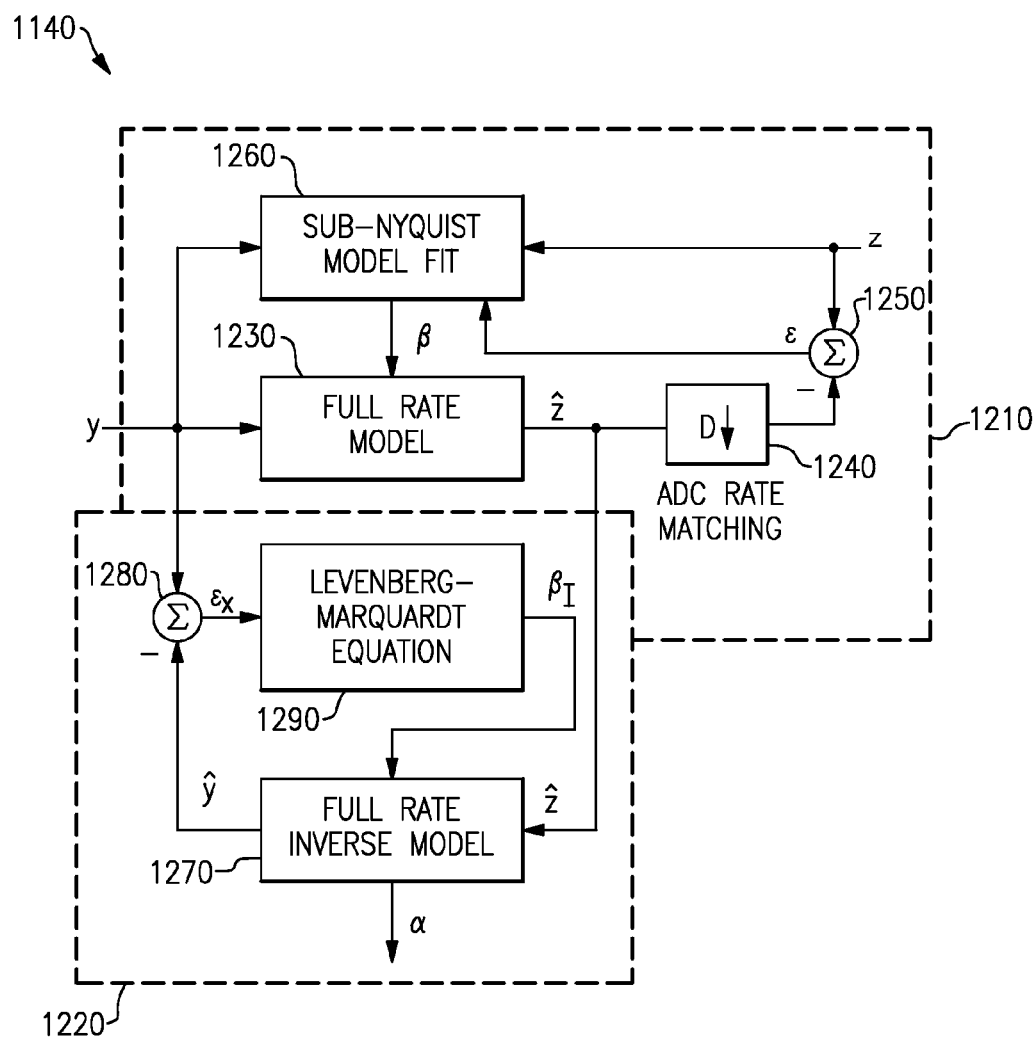
FIG. 12B is a schematic block diagram of an illustrative a DPD adaptation circuit of FIG. 12A, according to an embodiment.

FIG. 12B is a schematic block diagram of an illustrative DPD adaptation circuit 1140 of FIG. 12A. The adaptation circuit 1140 includes a power amplifier model circuit 1210 and a power amplifier inverse model circuit 1220. The power amplifier model circuit 1210 fits a model of the power amplifier 150 of FIG. 12A using sub-Nyquist data from the DPD receiver 1115 and generates a full rate model response from the model fit. The power amplifier inverse model circuit 1220 generates the predistortion coefficients α from the virtual full rate model response $\hat{z}$ provided by the power amplifier model circuit 1210. While the DPD adaptation circuit 1140 is described in connection with a DPD receiver with sub-Nyquist ADC for illustrative purposes, it will be understood that generally any of the principles and advantages discussed with reference to the adaptation circuit 1140 can be applied to narrowband indirect DPD receivers discussed herein, as appropriate. For instance, by replacing a sub-Nyquist model fit with a narrowband model fit and replacing the decimator with a circuit to isolate a selected sub-band of the virtual full rate model the principles and advantages discussed with reference to the DPD adaptation circuit 1140 can be applied to narrowband feedback data.

In FIG. 12B, the illustrated power amplifier model circuit 1210 includes a full rate model circuit 1230, a decimator 1240, an error detection circuit 1250, and a sub-Nyquist fit circuit 1260. The power amplifier model circuit 1210 can receive the predistorted input signal Y, which has the full signal bandwidth. The full rate model circuit 1230 can process the full signal bandwidth of the amplified RF signal $Z_T$, which can be referred to as running at full rate. The full rate model circuit 1230 can generate a virtual full rate model response $\hat{z}$ of the predistorted input signal Y. The decimator 1240 can decimate the virtual full rate model response $\hat{z}$ to match the rate of the sub-Nyquist ADC 1110. This can model the aliasing effect of sub-Nyquist ADC sampling by the sub-Nyquist ADC 1110. The decimated virtual full rate model provided by the decimator 1240 can have a sub-Nyquist bandwidth corresponding to the bandwidth of the aliased feedback signal $Z_{FA}$. Error modeling and coefficient updating can then occur at a reduced rate relative to the full rate. The error detection circuit 1250 can compare the difference between the decimated virtual full rate model and the aliased feedback signal $Z_{FA}$ to generate an error signal ϵ. The error signal ϵ can be provided to the sub-Nyquist fit circuit 1260 to generate update coefficients β to provide to the full rate model circuit 1230. The nonlinear full rate model 1230 can update the virtual full rate model response $\hat{z}$ based on the update coefficients β.

The illustrated power amplifier inverse model circuit 1220 includes a full rate inverse model circuit 1270, a second error detection circuit 1280, and a full rate inverse model update circuit 1290. As illustrated, the virtual full rate power amplifier model response $\hat{z}$ extracted using the sub-Nyquist feedback signal $Z_{FA}$ is provided to the full rate inverse model circuit 1270. As such, the predistortion coefficients α can be derived from the virtual full rate power amplifier model response $\hat{z}$. The second error detection circuit 1280 can generate an error signal $\epsilon_X$ indicative of the difference between the predistorted input signal Y and a virtual full rate model of the predistorted input signal $\hat{Y}$. The error signal $\epsilon_X$ can be provided to the update circuit 1290. The update circuit 1290 can generate inverse model update coefficients $\beta_I$ using a suitable update equation, such as a Levenberg-Marquardt equation. The inverse model update coefficients $\beta_I$ can be provided to the full rate inverse model circuit 1270 to update the predistortion coefficients α.

Figure 13:
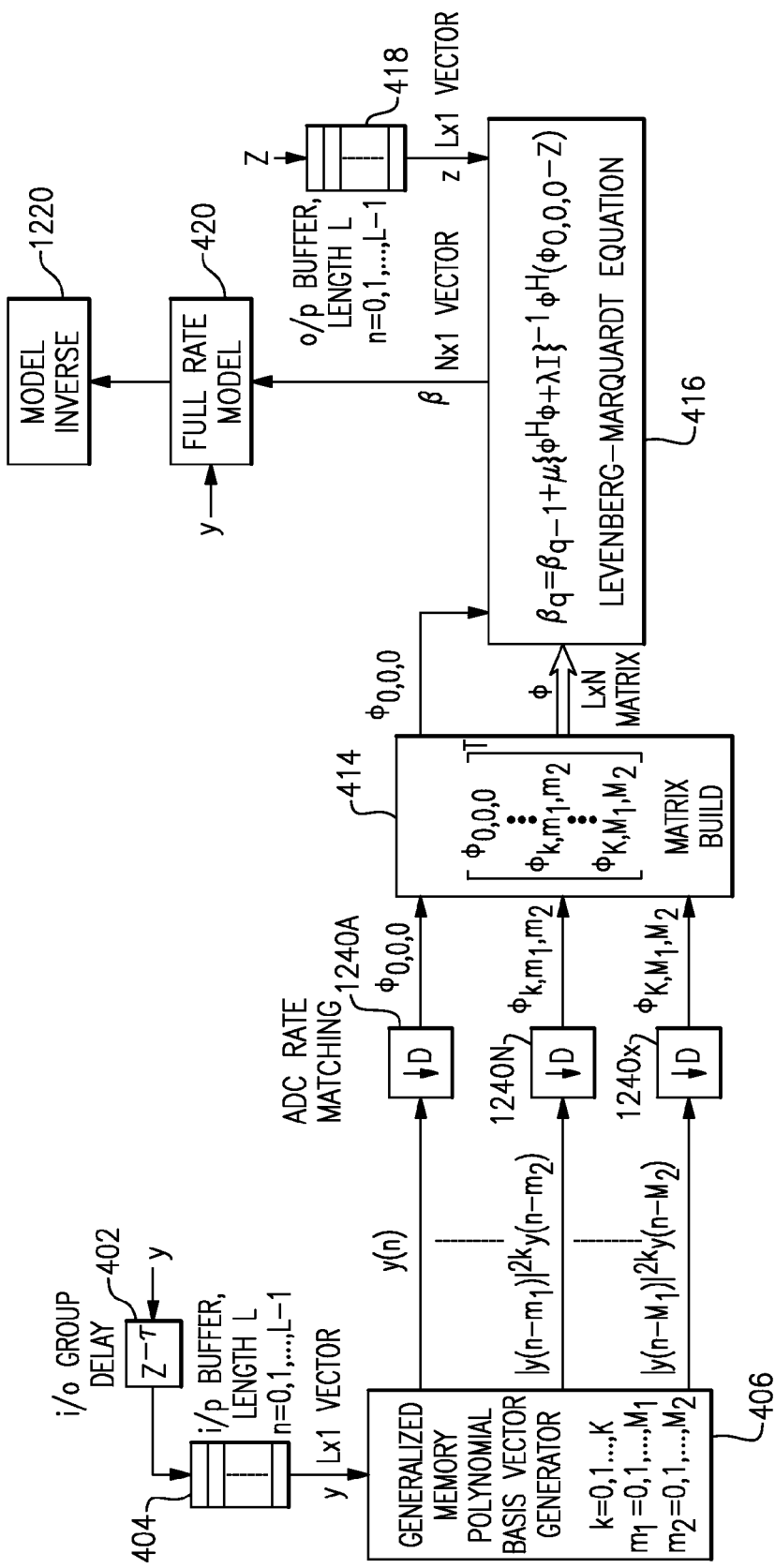
FIG. 13 illustrates a sub-Nyquist power amplifier modeling engine, according to an embodiment.

With reference to FIG. 13, an illustrative sub-Nyquist power amplifier modeling engine will be described. Elements that are substantially the same or functionally similar to the embodiment of FIG. 4 are numbered similarly in FIG. 13. FIG. 13 illustrates example equations that can fit a model to a power amplifier using the feedback generated using a sub-Nyquist ADC 1110. As in the narrowband receiver embodiments with indirect DPD discussed above, a virtual full rate model response $\hat{z}$ can be generated using feedback from the receiver and the predistorted input signal Y. Then using the predistorted input signal Y and the virtual full rate model response $\hat{z}$, an inverse power amplifier model can be fit at full rate to extract the predistortion coefficients α.

In FIG. 13, the sub-Nyquist power amplifier modeling engine generates a full rate generalized polynomial model of the power amplifier using the basis vector generator circuit 406. The basis vectors are generated from the full rate predistorted input signal Y. The decimators 1240A to 1240X can decimate the full rate basis vectors to match the rate of the sub-Nyquist ADC 1110 in the receiver 1115. In other embodiments (not illustrated), the basis vectors can be rate matched to the sub-Nyquist ADC 1110 in the receiver 1115 in any other suitable manner. With rate matched basis vectors, the power amplifier model can be aliased similar to the feedback in the receiver 1115. The update coefficients β can be updated offline by the update circuit 416. The update circuit 416 of FIG. 13 can implement any suitable combination of features of the update circuits described herein. For instance, the update circuit 416 can implement a Levenberg-Marquardt Algorithm as illustrated. In the Levenberg-Marquardt Algorithm, q can represent the $q^{th}$ iteration of update equation, m>0 can represent a damping factor (scalar) to control convergence, and l>0 can represent a regularization factor (scalar) to control over fitting and numerical issues. The update coefficients β can be generated off line using buffered input/output data. The update coefficients β can be provided to the full rate model circuit 420, which can virtual full rate model response $\hat{z}$ and provide the virtual full rate model response $\hat{z}$ to the model inverse circuit 1220.

Figure 14:
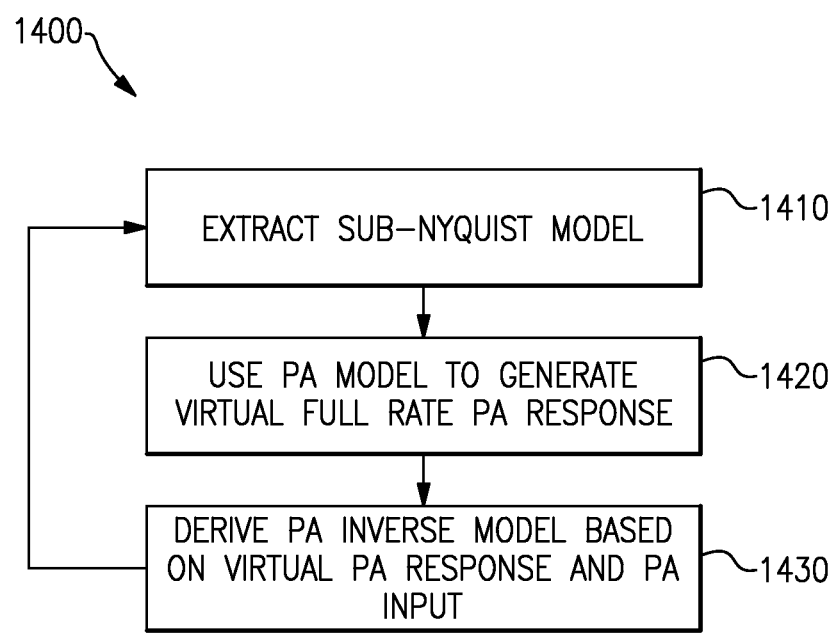
FIG. 14 is a flow diagram of an illustrative process of updating digital predistortion coefficients using a sub-Nyquist indirect DPD algorithm, according to an embodiment.

FIG. 14 is a flow diagram of an illustrative process 1400 of updating digital predistortion coefficients using a sub-Nyquist indirect DPD algorithm according to an embodiment. The process 1400 can be performed, for example, in communications systems that include any combination of features discussed with reference to FIGS. 11 to 13. The illustrated process 1400 includes extracting a sub-Nyquist model at block 1402. The sub-Nyquist model can be extracted using a sub-Nyquist ADC in the receiver and a rate matched indication of the input to a power amplifier. Then DPD can be updated. At block 1404, a virtual full rate power amplifier response can be generated using the sub-Nyquist model. The power amplifier inverse model can be derived based on the virtual full rate power amplifier response and the power amplifier input/output at block 1406. This process can be iterated, for example, until the power amplifier inverse model converges. The power amplifier inverse model can be used to cause a predistortion in the input the power amplifier to thereby improve efficiency and/or linearity of the power amplifier.

Applications

The systems, apparatus, and methods related to DPD are described above with reference to certain embodiments. A skilled artisan will, however, appreciate that the principles and advantages of the embodiments can be used for any other systems, apparatus, or methods with a need for DPD and/or improving linearity of a non-linear circuit.

Such systems, apparatus, and/or methods can be implemented in various electronic devices. Examples of the electronic devices can include, but are not limited to, consumer electronic products, parts of the consumer electronic products, electronic test equipment, wireless communications infrastructure such as cellular base stations, etc. Examples of the electronic devices can also include cable transmitters, cable headends, cable distribution hubs, memory chips, memory modules, circuits of optical networks or other communication networks, and disk driver circuits. The consumer electronic products can include, but are not limited to, measurement instruments, medical devices, wireless devices, a mobile phone (for example, a smart phone), a telephone, a television, a set top box, a modem, a router, a computer monitor, a computer, a handheld computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

TERMINOLOGY

Unless the context clearly requires otherwise, throughout the description and the clauses, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description of Certain Embodiments using singular or plural may also include the plural or singular, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. For instance, any suitable combination of features related to narrowband receivers discussed herein can be combined with any suitable combination of features related to receivers with sub-Nyquist ADCs. The acts of any method discussed herein can be performed in any order as appropriate. Moreover, the acts of any method discussed herein can be performed serially or in parallel, as appropriate.

While certain embodiments of the inventions have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure.

What is claimed is:

1. An electronically-implemented method of predistortion, the method comprising:
    receiving, by a receiver, a feedback signal indicative of an output of an amplifier, the feedback signal having a feedback signal bandwidth, wherein the receiver has a receiver bandwidth that is narrower than the feedback signal bandwidth;
    sweeping, by the receiver, through a plurality of isolated sub-bands of the feedback signal to observe the feedback signal bandwidth, the plurality of isolated sub-bands comprising a first isolated sub-band and a second isolated sub-band, wherein a combined bandwidth of the plurality of the isolated sub-bands is greater than half of the feedback signal bandwidth, and wherein sweeping through the plurality of isolated sub-bands comprises:
        tuning the receiver to the first isolated sub-band; and
        after tuning the receiver to the first isolated sub-band, tuning the receiver to the second isolated sub-band;
    generating a virtual full-rate response for the amplifier based at least in part on the plurality of isolated sub-bands of the feedback signal,
    adaptively adjusting predistortion coefficients based at least in part on the virtual full-rate response for the amplifier; and
    using the adjusted predistortion coefficients, applying digital predistortion to cause an input to the amplifier to be predistorted.

2. The method of claim 1, further comprising performing an analog-to-digital conversion in the receiver at a sampling rate that is less than the feedback signal bandwidth.

3. The method of claim 1, further comprising sweeping, by the receiver through the plurality of isolated sub-bands at least one more time until the predistortion coefficients converge.

4. The method of claim 1, further comprising isolating sub-bands of a signal indicative of the input to the amplifier, wherein adjusting is based on the data generated from each of the isolated sub-bands of the feedback signal and the respective isolated sub-bands of the signal indicative of the input to the amplifier.

5. The method of claim 1, wherein sweeping comprises adjusting a frequency of a local oscillator of the receiver to adjust a translation of the feedback signal in the frequency domain.

6. The method of claim 1, wherein the plurality of isolated sub-bands comprises at least 100 isolated sub-bands.

7. The method of claim 1, wherein the feedback signal bandwidth is at least about 0.5 GHz.

8. The method of claim 1, wherein adjusting includes performing an indirect digital predistortion algorithm.

9. The method of claim 1, wherein adjusting includes performing a direct digital predistortion algorithm.

10. An apparatus comprising:
    a receiver configured to:
        receive a feedback signal indicative of an output of an amplifier; and
        generate narrowband feedback for a plurality of sub-bands of a signal bandwidth of the feedback signal that together span more than half of the signal bandwidth, wherein the generating of the narrowband feedback comprises:

observing a first sub-band of the plurality of sub-bands;
generating first narrowband feedback corresponding to the first sub-band of the plurality of sub-bands;
observing a second sub-band of the plurality of sub-bands; and
generating a second narrowband feedback corresponding to the second sub-band of the plurality of sub-bands, wherein each of the plurality of sub-bands is narrower than the signal bandwidth;
a digital predistortion adaptation circuit configured to:
process a signal indicative of an input to the amplifier to isolate a first frequency band corresponding to the first sub-band of the signal bandwidth; and
update predistortion coefficients based on the first narrowband feedback and the corresponding first frequency band of the signal indicative of the input of the amplifier;
process the signal indicative of the input to the amplifier to isolate a second frequency band corresponding to the second sub-band of the signal bandwidth; and
update second predistortion coefficients based on the second narrowband feedback and the corresponding second frequency band of the signal indicative of the input to the amplifier; and
a digital predistortion actuator circuit configured to cause predistortion in the input to the amplifier based on the updated predistortion coefficients.

11. The apparatus of claim 10, wherein the receiver is further configured to perform diagnostics on a communications system that includes the amplifier.

12. The apparatus of claim 10, wherein the receiver is configured to sweep through the sub-bands of the entire signal bandwidth to generate narrowband feedback comprising the first narrowband feedback and the second narrowband feedback.

13. The apparatus of claim 10, wherein the digital predistortion adaptation circuit is configured to:
generate a full rate, full bandwidth amplifier model based on the first narrowband feedback and the second narrowband feedback; and
update the predistortion coefficients based on the full rate, full bandwidth amplifier model.

14. The apparatus of claim 10, wherein the apparatus comprises a cable transmitter, and wherein the cable transmitter comprises the amplifier.

15. The apparatus of claim 10, wherein the receiver comprises an analog-to-digital converter having a sampling rate that is less than the signal bandwidth of the feedback signal, and wherein the sampling rate is less than a bandwidth of an input signal to the analog-to-digital converter.

16. The apparatus of claim 10, wherein the digital predistortion adaptation circuit is configured to generate a full rate amplifier model based on the narrowband feedback signals and to generate an inverse amplifier model based on the full rate model.

17. The apparatus of claim 10, wherein the digital predistortion adaptation circuit is configured to implement direct digital predistortion adaptation.

18. The apparatus of claim 10, further comprising the amplifier, wherein the amplifier is a radio frequency power amplifier.

19. The apparatus of claim 10, wherein the plurality of sub-bands of the signal bandwidth comprise 100 sub-bands.

20. An apparatus comprising:
a receiver comprising a sub-Nyquist analog-to-digital converter configured to digitize an analog signal indicative of an output of an amplifier, wherein the analog signal is received at an input of the sub-Nyquist analog-to-digital converter, wherein the sub-Nyquist analog-to-digital converter has a sampling rate that is less than a signal bandwidth of the analog signal such that there is aliasing on a digitized feedback signal provided at an output of the sub-Nyquist analog-to-digital converter wherein the receiver is configured to sweep a plurality of isolated sub-bands of the analog signal, the plurality of isolated sub-bands comprising a first isolated sub-band and a second isolated sub-band, wherein a combined bandwidth of the plurality of isolated sub-bands is greater than half of a bandwidth of the analog signal, and wherein sweeping the plurality of isolated sub-bands comprises:
tuning the receiver to the first isolated sub-band; and
after tuning the receiver to the first isolated sub-band, tuning the receiver to the second isolated sub-band;
a digital predistortion adaptation circuit in communication with the receiver, the digital predistortion adaptation circuit configured to generate an amplifier model based on the digitized feedback signal, wherein the amplifier model has a bandwidth corresponding to the signal bandwidth of the feedback signal; and
a digital predistortion actuator circuit in communication with the digital predistortion adaptation circuit, the digital predistortion actuator circuit configured to introduce predistortion to an input provided to the amplifier based on the amplifier model.

21. The apparatus of claim 20, wherein the digital predistortion adaptation circuit comprises a decimator configured to rate match an indication of the amplifier input to the sampling rate of the analog-to-digital converter.

22. The apparatus of claim 20, wherein the digital predistortion adaptation circuit is configured to generate predistortion coefficients based on the amplifier model and to provide the predistortion coefficients to the digital predistortion actuator circuit.

23. The apparatus of claim 20, wherein the sampling rate of the analog-to-digital converter is at least 5 times less than the signal bandwidth of the analog signal.

24. The apparatus of claim 20, wherein the signal bandwidth of the analog signal is at least about 0.5 GHz.

25. A method for generating a predistorted amplifier input signal, comprising:
receiving a feedback signal indicative of an output of an amplifier;
observing a plurality of sub-bands of the feedback signal, wherein a sum of bandwidths of the plurality of sub-bands is greater than or equal to half of a feedback signal bandwidth, and wherein the observing comprises:
tuning a receiver to a first sub-band of the plurality of sub-bands; and
after tuning the receiver to the first sub-band, tuning the receiver to a second sub-band of the plurality of sub-bands;
generating a predistorted amplifier input signal for the amplifier with a digital predistortion actuator circuit;
generating a virtual response for the amplifier based at least in part on the plurality of sub-bands wherein a bandwidth of the virtual response is greater than the sum of the bandwidths of the plurality of sub-hands; and
adjusting the digital predistortion circuit with a digital predistortion adaption circuit based at least in part on the virtual response for the amplifier.

26. The method of claim 25, further comprising:
generating the predistorted amplifier input signal with the digital predistortion actuator circuit based at least in part on a first predistortion coefficient; and
modifying the first predistortion coefficient with the digital predistortion adaption circuit based at least in part on data generated from the plurality of sub-bands of the feedback signal.

27. The method of claim 25, further comprising:
isolating a first frequency band of a signal indicative of an input to the amplifier, wherein the first frequency band corresponds to the first sub-band;
updating the digital predistortion actuator circuit based at least in part on the first sub-band and the first frequency band;
isolating a second frequency band of the signal indicative of the input to the amplifier, wherein the second frequency band corresponds to the second sub-band; and
updating the digital predistortion actuator circuit based at least in part on the second sub-band and the second frequency band.

28. The method of claim 25, further comprising:
applying, with the digital predistortion actuator circuit, a plurality of predistortion coefficients to a signal indicative of an input to the amplifier; and
adaptively adjusting the plurality of predistortion coefficients with the digital predistortion adaption circuit based at least in part on data generated from the plurality of sub-bands of the feedback signal.

* * * * *